United States Patent
Taniuchi et al.

(10) Patent No.: US 11,528,803 B2
(45) Date of Patent: Dec. 13, 2022

(54) WIRING CIRCUIT BOARD ASSEMBLY SHEET, PRODUCING METHOD THEREOF, AND PRODUCING METHOD OF WIRING CIRCUIT BOARD

(71) Applicant: NITTO DENKO CORPORATION, Osaka (JP)

(72) Inventors: Takuya Taniuchi, Osaka (JP); Naoki Shibata, Osaka (JP); Ryosuke Sasaoka, Osaka (JP); Yasunari Oyabu, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 17/058,513

(22) PCT Filed: May 10, 2019

(86) PCT No.: PCT/JP2019/018717
§ 371 (c)(1),
(2) Date: Nov. 24, 2020

(87) PCT Pub. No.: WO2019/230338
PCT Pub. Date: Dec. 5, 2019

(65) Prior Publication Data
US 2021/0204402 A1 Jul. 1, 2021

(30) Foreign Application Priority Data
May 31, 2018 (JP) .............................. JP2018-104663

(51) Int. Cl.
*H05K 1/02* (2006.01)
*H05K 1/11* (2006.01)
*H05K 3/06* (2006.01)

(52) U.S. Cl.
CPC ........... *H05K 1/0298* (2013.01); *H05K 3/064* (2013.01); *H05K 1/0296* (2013.01); *H05K 1/11* (2013.01)

(58) Field of Classification Search
CPC ....... H05K 1/0298; H05K 3/064; H05K 1/144
See application file for complete search history.

(56) References Cited

U.S. PATENT DOCUMENTS 8,658,906 B2 * 2/2014 Ishii ..................... H05K 3/0097
174/255
9,980,390 B2 * 5/2018 Terada ................... H05K 1/118
(Continued)

FOREIGN PATENT DOCUMENTS

JP   H06-164103 A   6/1994
JP   10-135279 A    5/1998
(Continued)

OTHER PUBLICATIONS

International Search Report Issued in PCT/JP2019/018717 dated Jul. 16, 2019.
(Continued)

*Primary Examiner* — Ishwarbhai B Patel
(74) *Attorney, Agent, or Firm* — Edwards Neils LLC; Jean C. Edwards, Esq.

(57) ABSTRACT

A wiring circuit board assembly sheet includes a support sheet having two end edges parallel with each other and a plurality of wiring circuit boards disposed at spaced intervals to each other in the support sheet. The wiring circuit board includes a metal-based portion having a generally rectangular frame shape. The metal-based portion includes a first piece along a first direction perpendicular to a thickness direction of the support sheet, and a second piece along a second direction perpendicular to the thickness direction and
(Continued)

the first direction. Both the first piece and the second piece are inclined with respect to the end edge of the support sheet.

3 Claims, 9 Drawing Sheets

(56) References Cited

U.S. PATENT DOCUMENTS

| | | | |
|---|---|---|---|
| 2006/0169486 A1* | 8/2006 | Funada | H05K 3/0052 |
| | | | 174/254 |
| 2010/0155113 A1* | 6/2010 | Kamei | H05K 1/0271 |
| | | | 174/255 |
| 2011/0061900 A1* | 3/2011 | Umetani | H05K 3/0097 |
| | | | 174/250 |
| 2013/0233607 A1 | 9/2013 | Nakamura et al. | |
| 2017/0019985 A1* | 1/2017 | Sugimoto | H05K 1/115 |
| 2017/0257954 A1* | 9/2017 | Ishii | H05K 3/4644 |

FOREIGN PATENT DOCUMENTS

| | | |
|---|---|---|
| JP | 2002-026490 A | 1/2002 |
| JP | 2004-165375 A | 6/2004 |
| JP | 2013-187313 A | 9/2013 |

OTHER PUBLICATIONS

Written Opinion Issued in PCT/JP2019/018717 on Jul. 16, 2019, (no English translation of the relevant portion attached).
International Preliminary Report on Patentability issued by WIPO dated Dec. 1, 2020, in connection with International Patent Application No. PCT/JP2019/018717.
Office Action, issued by the Taiwanese Intellectual Property Office dated Oct. 7, 2022, in connection with Taiwanese Patent Application No. 108117071.

* cited by examiner

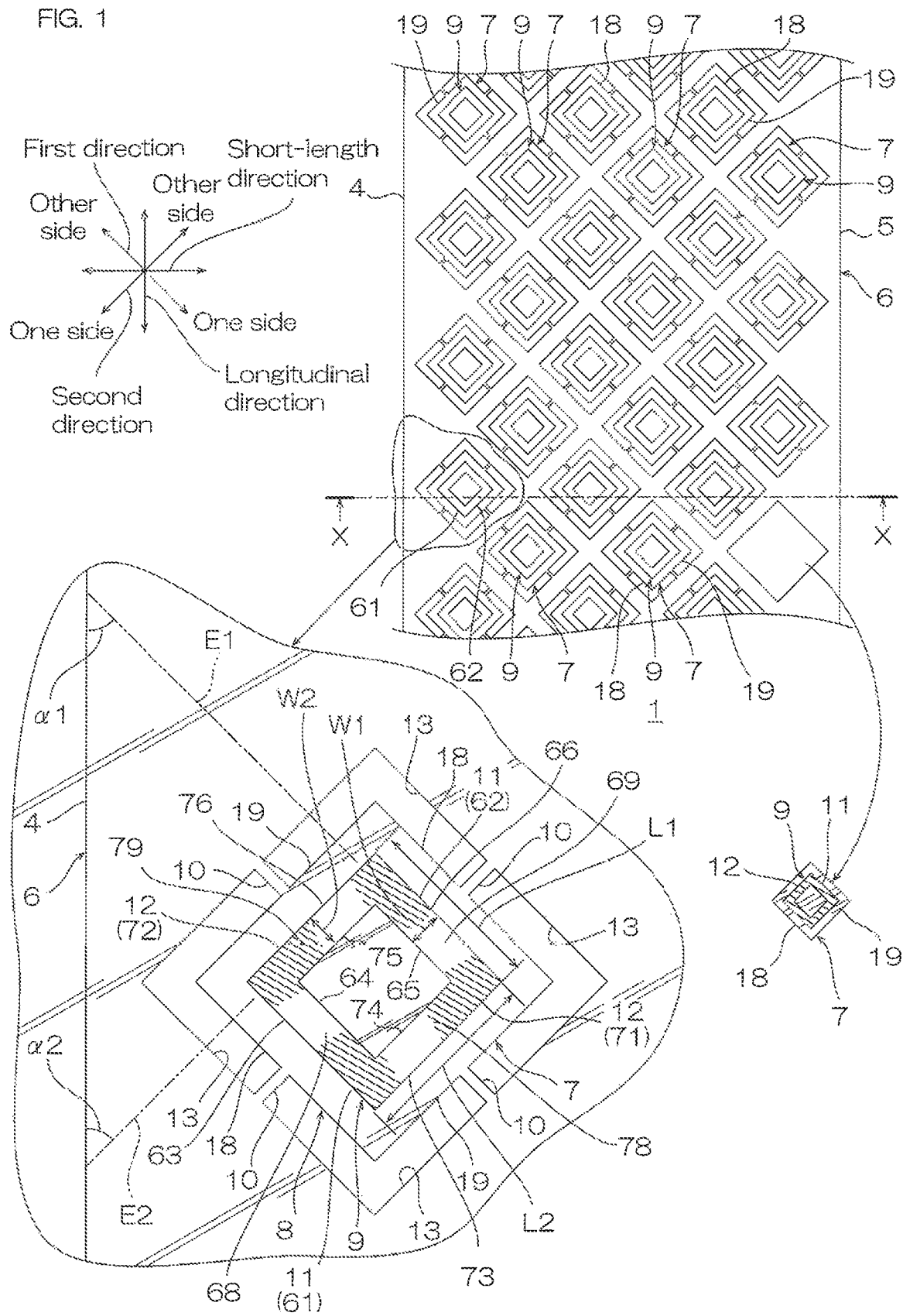

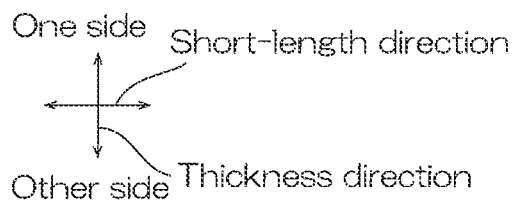
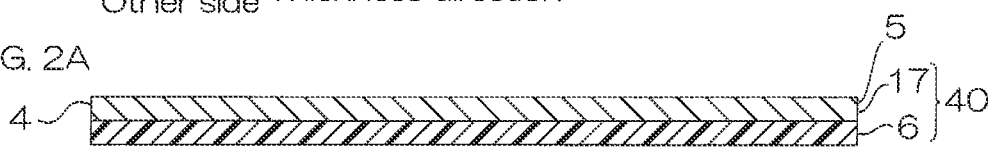
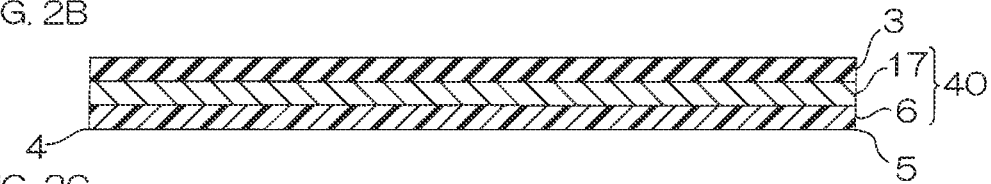
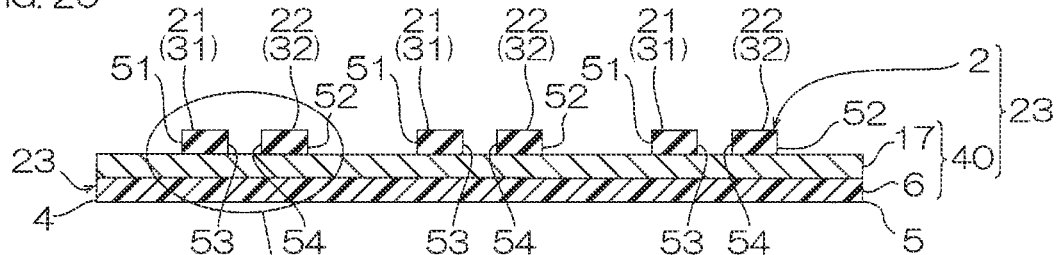
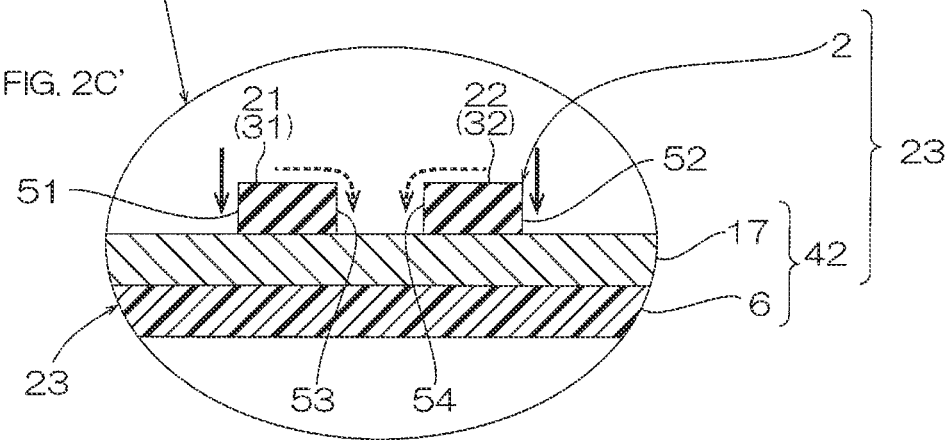
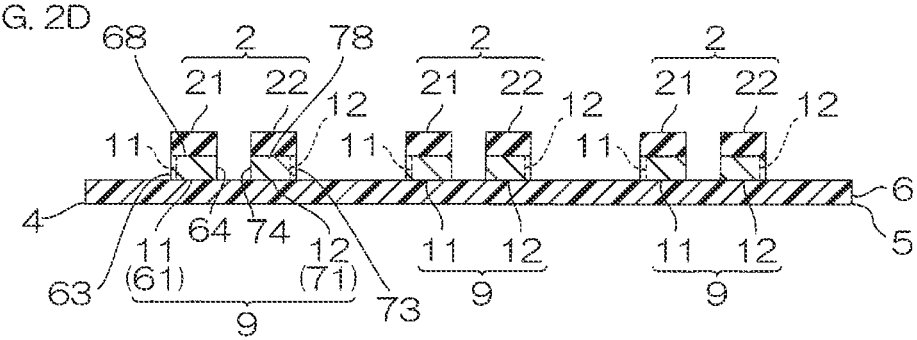

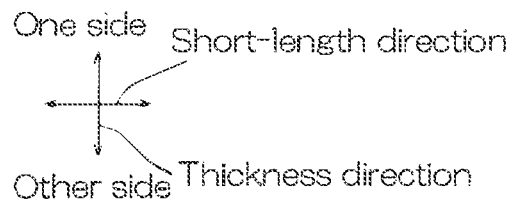
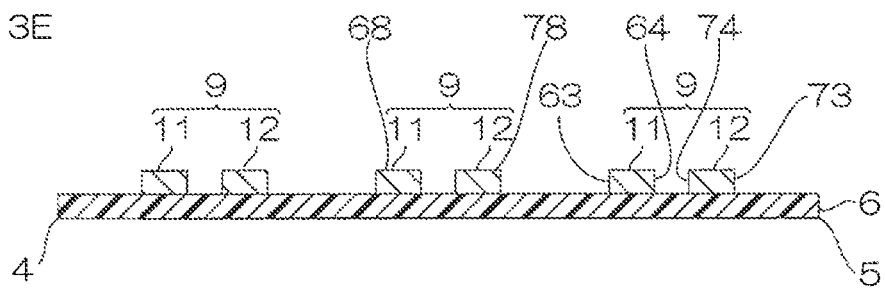
FIG. 3E
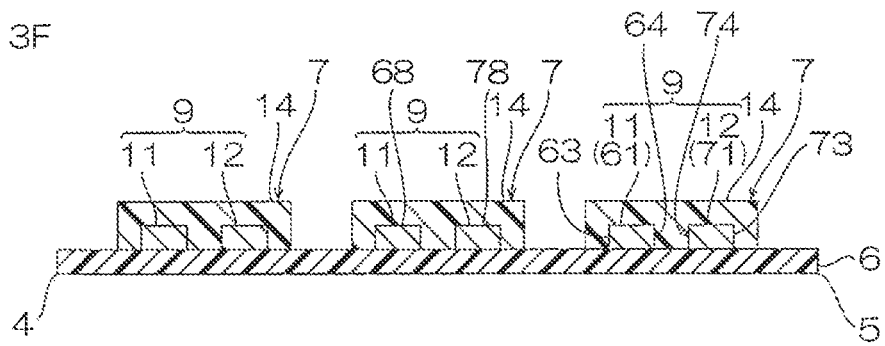
FIG. 3F
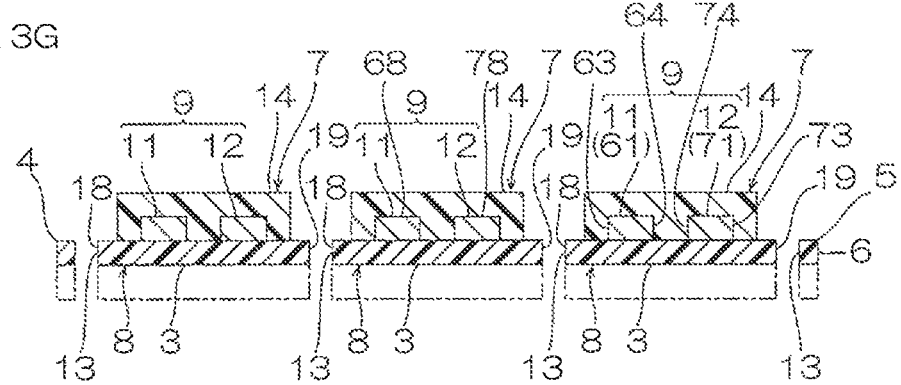
FIG. 3G

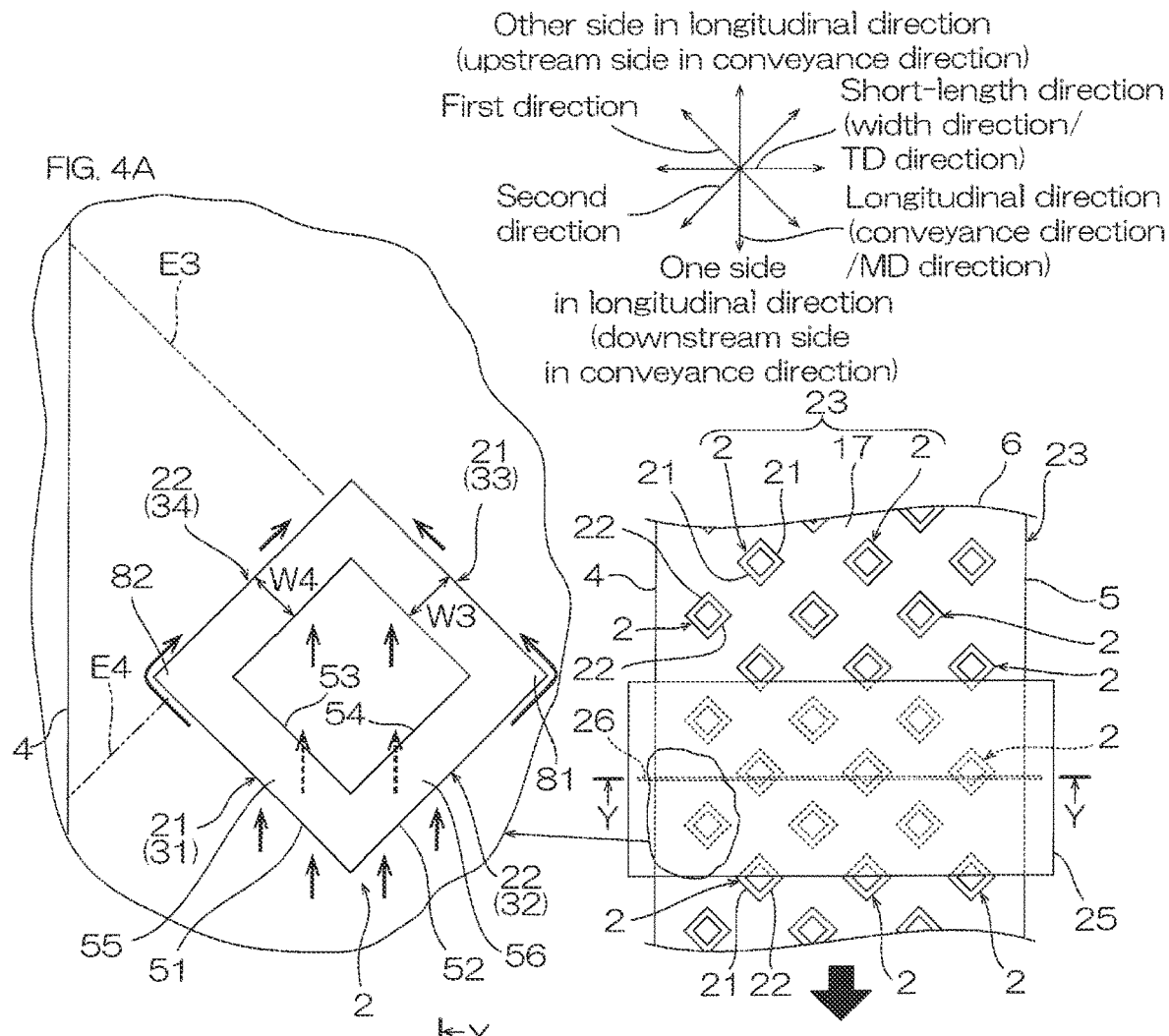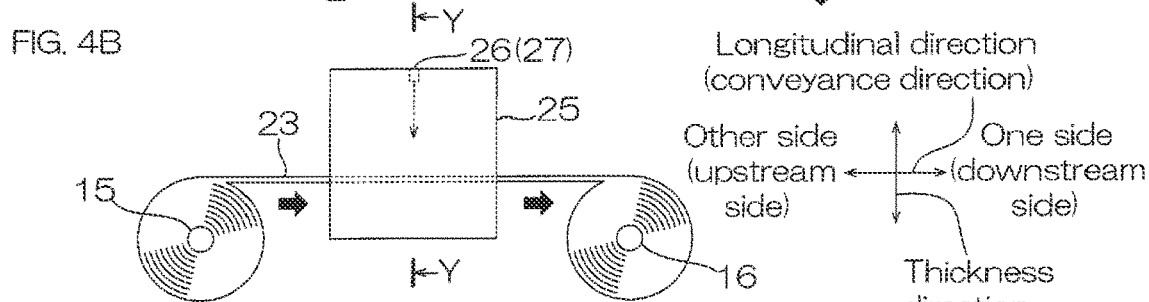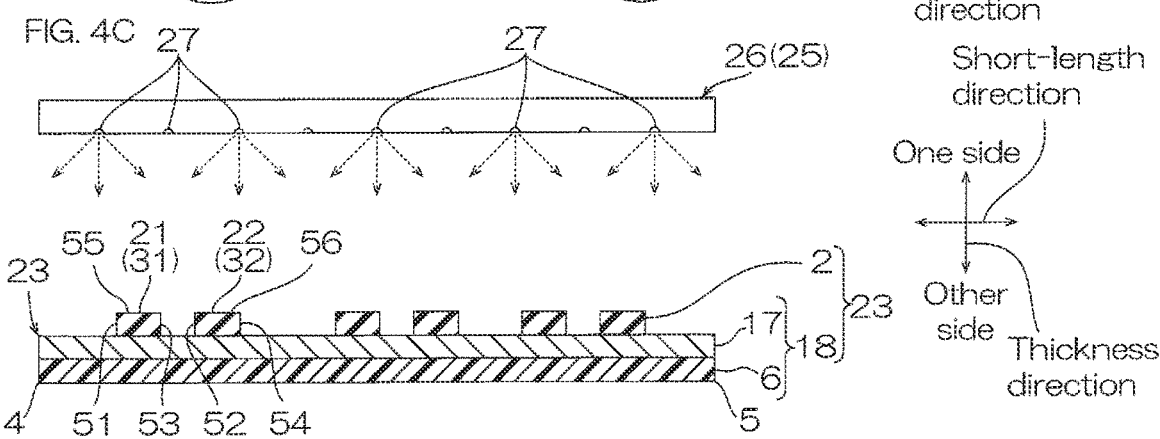

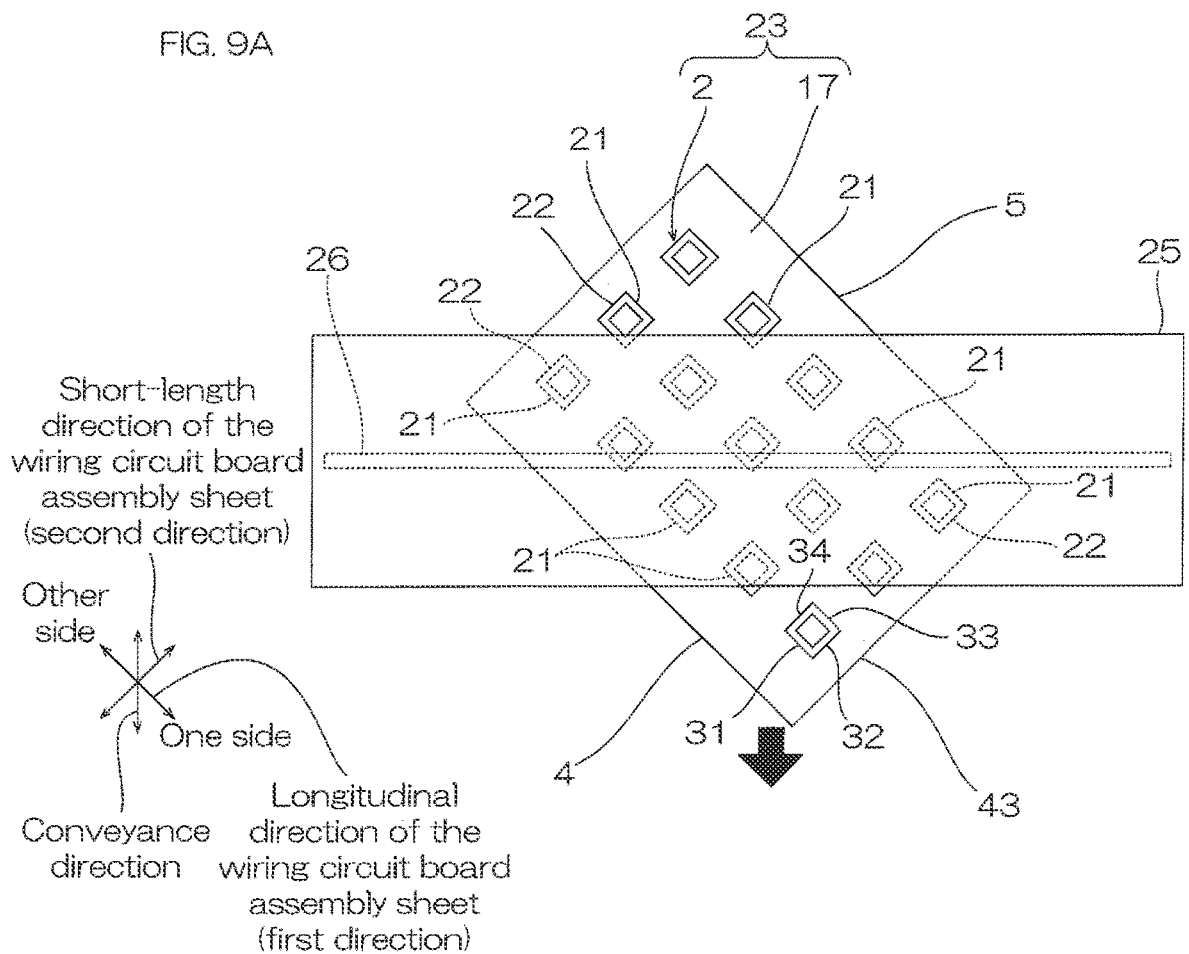
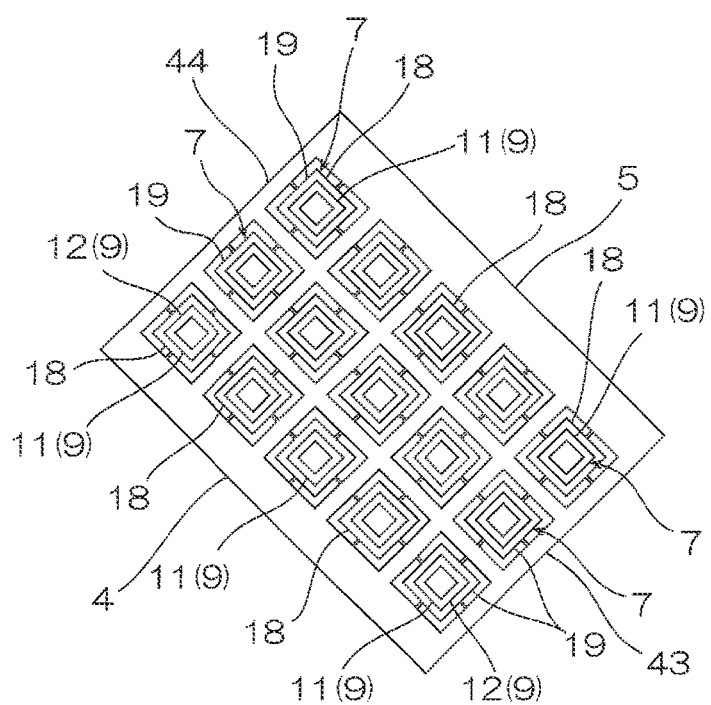

WIRING CIRCUIT BOARD ASSEMBLY SHEET, PRODUCING METHOD THEREOF, AND PRODUCING METHOD OF WIRING CIRCUIT BOARD

CROSS-REFERENCE TO RELATED APPLICATIONS

The present application is a 35 U.S.C. 371 National Stage Entry PCT/JP2019/018717, filed on May 10, 2019, which claims priority from Japanese Patent Application No. 2018-104663, filed on May 31, 2018, the contents of all of which are herein incorporated by reference in their entirety.

TECHNICAL FIELD

The present invention relates to a wiring circuit board assembly sheet, a method for producing a wiring circuit board assembly sheet, and a method for producing a wiring circuit board.

BACKGROUND ART

Conventionally, a method for producing an assembly sheet including a plurality of conductive patterns has been known in which the plurality of rectangular-shaped conductive patterns are formed on a sheet-shaped support sheet extending in all directions (ref: for example, Patent Document 1).

In Patent Document 1, each of the plurality of conductive patterns integrally has front and rear pieces extending in a right-left direction and parallel with each other, and right and left pieces connecting both end edges of these, extending in a front-rear direction, and parallel with each other.

CITATION LIST

Patent Document

Patent Document 1: Japanese Unexamined Patent Publication No. 2004-165375

SUMMARY OF THE INVENTION

Problem to be Solved by the Invention

However, when the conductive pattern described in Patent Document 1 is formed by a subtractive method of etching a flat plate-shaped conductive sheet, first, an etching resist is disposed on the surface of the conductive sheet in a predetermined pattern to be then conveyed toward an etching device.

The etching resist has the front and rear pieces, and the right and left pieces having the same pattern as the conductive pattern to be formed. Further, the support sheet has two end edges which are parallel along a conveyance direction, and the right and left pieces of the etching resist are parallel with the end edges and, also, an extension line of the front and rear pieces of the etching resist is perpendicular to the end edges. On the other hand, in the etching device, a discharge port of an etching solution is disposed in alignment along the right-left direction perpendicular to the conveyance direction of a laminate.

Then, in the etching device, a metal-based sheet exposed from the etching resist is brought into contact with the etching solution discharged along the right-left direction, while the laminate progresses in the conveyance direction.

At this time, the etching solution collides with the front piece of the etching resist, and vigorously etches the metal-based sheet in front of the front piece.

Subsequently, the etching solution flows along the right and left pieces of the etching resist, and by the etching solution, the metal-based sheet outside of the right and left pieces are slowly etched as compared with the etching of the metal-based sheet in front of the front piece.

Furthermore, the etching solution flowing through the outside of the right and left pieces very gently wraps around the rear piece of the etching resist. Therefore, by such an etching solution, the metal-based sheet behind the rear piece is slowly etched as compared with the etching of the metal-based sheet outside of the right and left pieces.

Therefore, the positional accuracy of the outer shape of the front piece, and the right and left pieces of the conductive pattern corresponding to the front piece, and the right and left pieces of the etching resist is reduced. Further, the positional accuracy of the outer shape of the rear piece, and the right and left pieces of the conductive pattern corresponding to the rear piece, and the right and left pieces of the etching resist is reduced. Therefore, there is a problem that the conductive pattern cannot obtain desired electrical properties.

The present invention provides a method for producing a wiring circuit board assembly sheet which can form the outer shape of a first piece and a second piece with excellent positional accuracy, a wiring circuit board assembly sheet produced by the method, and a method for producing a wiring circuit board produced from them.

Means for Solving the Problem

The present invention (1) includes a wiring circuit board assembly sheet including a support sheet having two end edges parallel with each other and a plurality of wiring circuit boards disposed at spaced intervals to each other in the support sheet, wherein the wiring circuit board includes a metal-based portion having a generally rectangular frame shape, the metal-based portion includes a first piece along a first direction perpendicular to a thickness direction of the support sheet, and a second piece along a second direction perpendicular to the thickness direction and the first direction, and both the first piece and the second piece are inclined with respect to the end edges of the support sheet.

In the wiring circuit board assembly sheet, when the metal-based portion of the wiring circuit board assembly sheet is formed by a pattern forming device disposed in a direction perpendicular to a conveyance direction, while the support sheet is conveyed along the direction in which the two end edges extend, both the first piece and the second piece are inclined with respect to the conveyance direction. Therefore, both the first piece and the second piece are also inclined with respect to the pattern forming device. Then, both the first piece and the second piece are formed by the pattern forming device under the same etching conditions. Therefore, the outer shape of the first piece and the second piece is formed with the same accuracy. As a result, the wiring circuit board assembly sheet can include the wiring circuit board including the metal-based portion having excellent positional accuracy of the outer shape.

The present invention (2) includes the wiring circuit board assembly sheet described in (1), wherein the metal-based portion includes a wiring.

In the wiring circuit board assembly sheet, since the metal-based portion includes the wiring, it is possible to achieve desired electrical properties.

The present invention (3) includes the wiring circuit board assembly sheet described in (1) or (2), wherein the metal-based portion includes a support layer.

In the wiring circuit board assembly sheet, since the metal-based portion includes the support layer, it is possible to achieve desired thermal conductivity.

The present invention (4) includes a method for producing a wiring circuit board assembly sheet including a support sheet and a plurality of wiring circuit boards disposed at spaced intervals to each other in the support sheet including a first step of disposing an etching resist having a generally rectangular frame shape and including a first resist piece along a first direction perpendicular to a thickness direction of the support sheet and a second resist piece along a second direction perpendicular to the thickness direction and the first direction on a metal-based sheet to fabricate a resist laminate including the metal-based sheet and the etching resist and a second step of moving the resist laminate, etching the metal-based sheet exposed from the etching resist, and forming a metal-based portion having a generally rectangular frame shape and including a first piece covered with the first resist piece and a second piece covered with the second resist piece to produce the wiring circuit board including the metal-based portion, wherein in the second step, the resist laminate is moved in a state where both the first resist piece and the second resist piece are inclined with respect to a moving direction of the resist laminate, and the metal-based sheet exposed from the etching resist is etched.

In the second step of the method for producing a wiring circuit board assembly sheet, both the first resist piece and the second resist piece are inclined with respect to the moving direction. Therefore, both the first resist piece and the second resist piece are also inclined with respect to the etching device. Then, both the first piece and the second piece are formed by the etching device under the same etching conditions. Therefore, the outer shape of the first piece and the second piece can be formed with the same accuracy. As a result, the wiring circuit board assembly sheet including the metal-based portion having excellent positional accuracy of the outer shape can be produced.

The present invention (5) includes the method for producing a wiring circuit board assembly sheet described in (4), wherein a length in the second direction of the first resist piece is the same as a length in the first direction of the second resist piece.

A portion of an etching solution passes over the first resist piece to etch the metal-based sheet in the vicinity of the other side in the second direction of the first resist piece, while the etching solution collides with the first resist piece to etch the metal-based sheet in the vicinity of one side in the second direction of the first resist piece. Also, a portion of the etching solution passes over the second resist piece to etch the metal-based sheet in the vicinity of the other side in the first direction of the second resist piece, while the etching solution collides with the second resist piece to etch the metal-based sheet in the vicinity of one side in the first direction of the second resist piece.

As described above, the etching of the metal-based sheet in the vicinity of one side in the second direction of the first resist piece, and the etching of the metal-based sheet in the vicinity of one side in the first direction of the second resist piece are carried out under the same conditions.

Then, in the producing method, in the first step, a length in the second direction of the first resist piece is the same as a length in the first direction of the second resist piece. Therefore, in the second step, the conditions in which the etching solution passes over the first resist piece can be the same as the conditions in which the etching solution passes over the second resist piece, and thus, the etching of the metal-based sheet in the vicinity of the other side in the second direction of the first resist piece and the etching of the metal-based sheet in the vicinity of the other side in the first direction of the second resist piece can be carried out under the same conditions.

Therefore, a length in the second direction of the first piece covered with the first resist piece can be the same as a length in the first direction of the second piece covered with the second resist piece.

The present invention (6) includes a method for producing a wiring circuit board including a step of producing a wiring circuit board assembly sheet by the method for producing a wiring circuit board assembly sheet described in (4) and a step of separating a wiring circuit board from a support sheet.

Since in the method for producing a wiring circuit board, the wiring circuit board assembly sheet described above is produced, and thereafter, the wiring circuit board is separated from the support sheet, it is possible to produce the wiring circuit board including the metal-based portion having excellent positional accuracy of the outer shape.

Effect of the Invention

The wiring circuit board assembly sheet of the present invention can include a wiring circuit board including a metal-based portion having excellent positional accuracy of the outer shape.

The method for producing a wiring circuit board assembly sheet of the present invention can produce a wiring circuit board assembly sheet including a metal-based portion having excellent positional accuracy of the outer shape.

The method for producing a wiring circuit board of the present invention can produce a wiring circuit board including a metal-based portion having excellent positional accuracy of the outer shape.

BRIEF DESCRIPTION OF THE DRAWINGS

FIG. 1 shows a plan view of one embodiment of a wiring circuit board assembly sheet of the present invention with the lower left view illustrating an enlarged view of a wiring circuit board supported by a support sheet and the lower right view illustrating an enlarged view of the wiring circuit board separated from the support sheet.

FIGS. 2A to 2D show steps for illustrating a method for producing the wiring circuit board assembly sheet shown in FIG. 1 and show cross-sectional views along an X-X line of FIG. 1:

FIG. 2A illustrating a substrate preparation step,

FIG. 2B illustrating a step of disposing a dry film resist,

FIG. 2C illustrating a resist disposing step of fabricating a resist laminate,

FIG. 2C' illustrating an enlarged cross-sectional view of the resist laminate shown in FIG. 2C, and FIG. 2D illustrating an etching step.

FIGS. 3E to 3G, subsequent to FIG. 2D, show steps for illustrating a method for producing the wiring circuit board assembly sheet shown in FIG. 1, and show cross-sectional views along the X-X line of FIG. 1:

FIG. 3E illustrating a resist removing step,

FIG. 3F illustrating a cover step, and

FIG. 3G illustrating an outer shape-trimming step.

FIGS. 4A to 4C show views for explaining details of the etching step shown in FIG. 2D:

FIG. 4A illustrating a plan view,

FIG. 4B illustrating a side view, and

FIG. 4C illustrating a front cross-sectional view along a Y-Y line of FIGS. 4A and 4B.

FIG. 5A illustrating a plan view,

FIG. 5B illustrating a front cross-sectional view of a resist laminate in the middle of etching, and FIG. 5C illustrating a front cross-sectional view of the resist laminate including a metal-based portion after etching.

FIG. 6A illustrating an embodiment including a metal-based portion consisting of a one-side first metal piece having a longer length in a second direction than an other-side first metal piece and a one-side second metal piece having a longer length in a first direction than an other-side second metal piece and FIG. 6B illustrating an embodiment including a metal-based portion consisting of a one-side first metal piece having a longer length in the second direction than a length in the first direction of a one-side second metal piece and an other-side first metal piece having a longer length in the second direction than a length in the first direction of an other-side second metal piece.

FIG. 7A illustrating a step of preparing a three-layer substrate,

FIG. 7B illustrating a first-time resist disposing step,

FIG. 7C illustrating a first-time etching step,

FIG. 7D illustrating a resist removing step, and

FIG. 7E illustrating a step of forming an insulating resin portion.

FIG. 8F illustrating a cover step,

FIG. 8G illustrating a second-time resist disposing step,

FIG. 8H illustrating a second-time etching step, and

FIG. 8I illustrating a resist removing step.

FIGS. 9A and 9B show plan views of a modified example of the method for producing a wiring circuit board assembly sheet shown in FIGS. 2A to 4C:

FIG. 9A illustrating a resist laminate conveyed to an etching device in the etching step and FIG. 9B illustrating a wiring circuit board assembly sheet to be obtained.

DESCRIPTION OF EMBODIMENTS

Figure 5A:
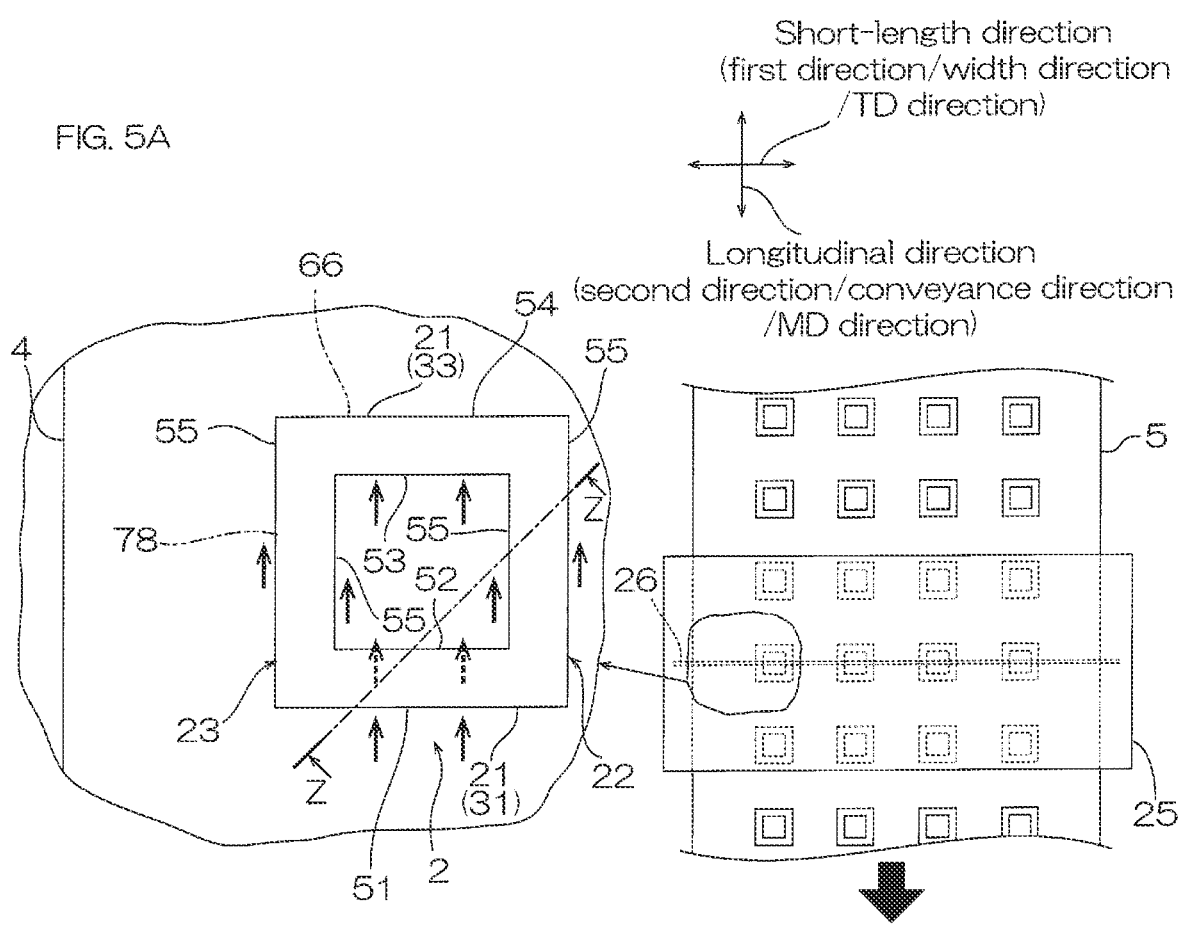
FIGS. 5A to 5C show a comparative example of a method for producing a wiring circuit board assembly sheet.

One embodiment of a wiring circuit board assembly sheet and a method for producing a wiring circuit board assembly sheet of the present invention is described with reference to FIGS. 1 to 4C. In FIG. 2C' and the left-side view of FIG. 4, a thick line arrow indicates the flow of an etching solution. In the right-side view of FIG. 4A and FIG. 4B, an bold arrow indicates a conveyance direction of a resist laminate.

As shown in FIG. 1, a wiring circuit board assembly sheet 1 has a long sheet shape extending along a longitudinal direction. As shown in FIG. 3G, the wiring circuit board assembly sheet 1 has a thickness, and includes one surface and the other surface in a thickness direction. As shown in FIGS. 1 and 3G, further, the wiring circuit board assembly sheet 1 has a length in a short-length direction perpendicular to the longitudinal direction and the thickness direction, and includes a short-length directional one end edge 4 and a short-length directional other end edge 5. The short-length directional one end edge 4 and the short-length directional other end edge 5 are parallel along the longitudinal direction.

A plane direction of the wiring circuit board assembly sheet 1 includes the longitudinal direction and the short-length direction described above. The thickness direction of the wiring circuit board assembly sheet 1 is a direction perpendicular to the plane direction. A length in the short-length direction of the wiring circuit board assembly sheet 1 is short with respect to a length in the longitudinal direction of the wiring circuit board assembly sheet 1.

The wiring circuit board assembly sheet 1 includes a support sheet 6 and a plurality of wiring circuit boards 7.

The support sheet 6 has the same shape (outer shape) when viewed from the top as the wiring circuit board assembly sheet 1. That is, the support sheet 6 includes the short-length directional one end edge 4 and the short-length directional other end edge 5 as one example of two end edges parallel with each other. The support sheet 6 is, for example, an insulating sheet. Examples of a material for the support sheet 6 include resins (resin materials having flexibility) such as polyimide. A thickness of the support sheet 6 is, for example, 1 μm or more, preferably 10 μm or more, and for example, 10 mm or less, preferably 1 mm or less.

The plurality of wiring circuit boards 7 are supported separately by the support sheet 6. The plurality of wiring circuit boards 7 are disposed in alignment at spaced intervals to each other in the support sheet 6.

The wiring circuit board 7 has a generally rectangular shape when viewed from the top (preferably, a generally square shape). Further, the wiring circuit board 7 includes two first end edges 18 along a first direction inclined with respect to the longitudinal direction and the short-length direction of the support sheet 6 and disposed to be opposed to each other in a second direction perpendicular to the first direction and the thickness direction. The two first end edges 18 have the same length.

Further, the wiring circuit board 7 includes two second end edges 19 along the second direction and disposed to be opposed to each other at spaced intervals in the first direction. The two second end edges 19 have the same length and connect the two first end edges 18. In the wiring circuit board 7, the two first end edges 18 and the two second end edges 19 are integrally formed. An inclination of the first direction and the second direction with respect to the longitudinal direction and the short-length direction is described in detail at the time of explanation of a metal-based portion 9.

The wiring circuit board 7 includes a support portion 8, the metal-based portion 9 disposed on one surface in the thickness direction of the support portion 8, and a cover layer 14 disposed on one surface in the thickness direction of the support portion 8 so as to cover the metal-based portion 9. The wiring circuit board 7 preferably includes only the support portion 8, the metal-based portion 9, and the cover layer 14.

The support portion 8 has the same shape when viewed form the top as the wiring circuit board 7. That is, the support portion 8 has a generally rectangular shape when viewed from the top. Specifically, the support portion 8 includes the two first end edges 18 along the first direction and disposed to be opposed to each other in the second direction. The two first end edges 18 have the same length.

The support portion 8 includes the two second end edges 19 along the second direction and disposed to be opposed to each other at spaced intervals in the first direction. The two second end edges 19 have the same length and connect the two first end edges 18. In the support portion 8, the two first end edges 18 and the two second end edges 19 are integrally formed.

Further, the support portion 8 is supported separably with respect to the support sheet 6. Specifically, an opening portion 13 is formed around the support portion 8, and the support portion 8 is connected to the support sheet 6 in the vicinity thereof through a joint 10. The opening portion 13 has a generally rectangular frame shape when viewed from the top surrounding the wiring circuit board 7. The joint 10 connects, for example, each of the four end edges (the two first end edges 18 and the two second end edges 19) to each of the four inner end edges facing the opening portion 13 in the support sheet 6. The joint 10 has a generally linear shape traversing the opening portion 13 formed around the support portion 8. Thus, the support portion 8 is suspended in the support sheet 6 across the opening portion 13 by the joint 10.

An external dimension of the support portion 8 is appropriately set in accordance with its application and purpose of the wiring circuit board 7. For example, the plane area of the support portion 8 is set so that a ratio thereof to the plane area of the metal-based portion 9 to be described later is within a range to be described later. The plane area of the support portion 8 is, for example, the same as the plane area of the wiring circuit board 7. A thickness and a material of the support portion 8 are the same as those of the support sheet 6.

The metal-based portion 9 has a generally rectangular frame shape, preferably a generally square frame shape when viewed from the top. Further, the metal-based portion 9 is included in the support portion 8 when projected in the thickness direction. The metal-based portion 9 is formed in a region excluding the central portion of the support portion 8 at the inside of the support portion 8 when viewed from the top. Examples of the metal-based portion 9 include wirings such as a signal line (differential wiring or the like), a power line (power supply wiring or the like), a ground line (ground wiring or the like), and an antenna line (transmission and reception line or the like). The metal-based portion 9 may further have, for example, an auxiliary portion (terminal or the like) (not shown) corresponding to the function of each wiring described above when viewed from the top.

The metal-based portion 9 has four pieces along each of the four end edges of the support portion 8. Specifically, the metal-based portion 9 integrally includes two first metal pieces 11 disposed at the inside of the two first end edges 18 along each of the two first end edges 18, and two second metal pieces 12 disposed at the inside of the two second end edges 19 along each of the two second end edges 19.

The two first metal pieces 11 have a generally linear shape along the first direction. The two first metal pieces 11 have the same length, and are parallel with each other. Further, the two first metal pieces 11 are disposed at spaced intervals to each other in the second direction. Each of the two first metal pieces 11 has, for example, a generally rectangular shape when viewed in the cross-sectional view. The two first metal pieces 11 consist of a one-side first metal piece 61 disposed on one side in the second direction, and an other-side first metal piece 62 disposed on the other side in the second direction thereof.

The one-side first metal piece 61 has a first outer-side surface 63 as an outer-side surface facing one side in the second direction, a first inner-side surface 64 as an inner-side surface facing the other-side first metal piece 62, and a first upper surface 68 connecting one end edges in the thickness direction of these. The first outer-side surface 63 and the first inner-side surface 64 are parallel with each other. The first upper surface 68 is parallel with one surface in the thickness direction of the support portion 8.

The other-side first metal piece 62 has a second inner-side surface 65 as an inner-side surface facing the one-side first metal piece 61, a second outer-side surface 66 as an outer-side surface facing the other side in the second direction, and a second upper surface 69 connecting the other end edges in the thickness direction of these. The second inner-side surface 65 and the second outer-side surface 66 are parallel with each other. The second upper surface 69 is parallel with one surface in the thickness direction of the support portion 8.

The first metal piece 11, specifically, the first direction along the first metal piece 11 is inclined with respect to the short-length directional one end edge 4 of the support sheet 6 when viewed from the top. Specifically, when viewed from the top, an angle formed between a first extension line E1 obtained by extending the first metal piece 11 and the short-length directional one end edge 4 of the support sheet 6 has at least a first acute angle $\alpha 1$, and the first acute angle $\alpha 1$ is, for example, 20 degrees or more, preferably, 30 degrees or more, more preferably, 40 degrees or more, and for example, 70 degrees or less, preferably 60 degrees or less, more preferably 50 degrees or less, particularly preferably 45 degrees.

A width W1 of the first metal piece 11 is a second directional length W1 of the first metal piece 11, and in particular, is the same length as each of a length between the first outer-side surface 63 and the first inner-side surface 64, and a length between the second inner-side surface 65 and the second outer-side surface 66. Specifically, the width W1 of the first metal piece 11 is, for example, 3 μm or more, preferably 10 μm or more, and for example, 1,000 μm or less, preferably 500 μm or less.

A first directional length L1 of the first metal piece 11 is, for example, 50 μm or more, preferably 100 μm or more, more preferably 300 μm or more, and for example, 10 mm or less. A ratio (L1/W1) of the first directional length L1 of the first metal piece 11 to the width W1 is, for example, 2 or more, preferably 5 or more, more preferably, 10 or more, and for example, 10,000 or less, preferably, 1,000 or less.

The two second metal pieces 12 have a generally linear shape along the second direction. The two second metal pieces 12 have the same length, and are parallel with each other. Further, the two second metal pieces 12 are disposed at spaced intervals to each other in the first direction. The two second metal pieces 12 connect both ends in the first direction of the two first metal pieces 11 along the second direction. Each of the two second metal pieces 12 has, for example, a generally rectangular shape when viewed in the cross-sectional view. The two second metal pieces 12 consist of a one-side second metal piece 71 disposed on one side in the first direction, and an other-side second metal piece 72 disposed on the other side in the first direction thereof.

The one-side second metal piece 71 has a third outer-side surface 73 as an outer-side surface facing one side in the first direction, a third inner-side surface 74 as an inner-side surface facing the other-side second metal piece 72, and a third upper surface 78 connecting one end edges in the thickness direction of these. The third outer-side surface 73 and the third inner-side surface 74 are parallel with each other. The third upper surface 78 is parallel with one surface in the thickness direction of the support portion 8.

The other-side second metal piece 72 has a fourth inner-side surface 75 as an inner-side surface facing the one-side second metal piece 71, a fourth outer-side surface 76 as an outer-side surface facing the other side in the first direction, and a fourth upper surface 79 connecting one end edges in the thickness direction of these. The fourth inner-side surface 75 and the fourth outer-side surface 76 are parallel with each other. The fourth upper surface 79 is parallel with one surface in the thickness direction of the support portion 8.

The second metal piece 12, specifically, the second direction along the second metal piece 12 is a direction perpendicular to the first direction (perpendicular direction). Therefore, the second direction (the second metal piece 12) is inclined with respect to the short-length directional one end edge 4 of the support sheet 6 when viewed from the top. Specifically, when viewed from the top, an angle formed between a second extension line E2 obtained by extending the second metal piece 12 and the short-length directional one end edge 4 of the support sheet 6 has at least a second acute angle α2. The total sum of the second acute angle α2 and the first acute angle α1 is a right angle.

A width W2 of the second metal piece 12 is a first directional length W2 of the second metal piece 12, and in particular, is the same length as each of a length between the third outer-side surface 73 and the third inner-side surface 74, and a length between the fourth inner-side surface 75 and the fourth outer-side surface 76. Specifically, the width W2 of the second metal piece 12 is, for example, 3 μm or more, preferably 10 μm or more, and for example, 1,000 μm or less, preferably 500 μm or less. A ratio (W2/W1) of the width W2 of the second metal piece 12 to the width W1 of the first metal piece 11 is, for example, 0.5 or more, preferably 0.8 or more, and for example, 1.5 or less, preferably 1.2 or less, particularly preferably 1.

A second directional length L2 of the second metal piece 12 is, for example, 50 μm or more, preferably 100 μm or more, more preferably 300 μm or more, and for example, 10 mm or less. A ratio (L2/W2) of the second directional length L2 of the second metal piece 12 to the width W2 is the same as the ratio (L1/W1) of the first directional length L1 of the first metal piece 11 to the width W1, and specifically, is, for example, 2 or more, preferably 5 or more, more preferably 10 or more, and for example, 10,000 or less, preferably 1,000 or less. A ratio (L2/L1) of the second directional length L2 of the second metal piece 12 to the first directional length L1 of the first metal piece 11 is, for example, 0.5 or more, preferably 0.8 or more, and for example, 1.5 or less, preferably 1.2 or less.

The plane area of the metal-based portion 9 is the total sum of the plane area of the first upper surface 68, the second upper surface 69, the third upper surface 78, and the fourth upper surface 79. A ratio of the plane area of the metal-based portion 9 to the plane area of the support portion 8 is relatively high, and is, for example, 0.5 or more, preferably above 0.5, more preferably 0.6 or more, further more preferably 0.8 or more, and for example, below 1.0, preferably 0.95 or less. A ratio of the plane area of the metal-based portion 9 to the plane area of the wiring circuit board 7 is the same as the ratio described above.

A thickness of the metal-based portion 9 is appropriately set. A thickness T1 of the first metal piece 11 and a thickness T2 of the second metal piece 12 are, for example, the same, and are, for example, 5 μm or more, preferably 50 μm or more, more preferably 100 μm or more, and for example, 1,000 μm or less, preferably 200 μm or less. A ratio (T1/W1) of the thickness T1 of the first metal piece 11 to the width W1 is, for example, 0.01 or more, preferably 0.1 or more, and for example, 100 or less, preferably 10 or less. A ratio (T2/W2) of the thickness T2 of the second metal piece 12 to the width W2 is the same as the ratio (T1/W1) described above.

A material for the metal-based support portion 9 can be, for example, appropriately selected and used from a known or conventional metal-based material (specifically, a metal material). Specifically, examples of the metal-based material include metal elements classified in the Group 1 to Group 16 of the Periodic Table and alloys including two or more metal elements. The metal-based material may be any of transition metals and typical metals. More specifically, examples of the metal-based material include Group 2 metal elements such as calcium, Group 4 metal elements such as titanium and zirconium, Group 5 metal elements such as vanadium, Group 6 metal elements such as chromium, molybdenum, and tungsten, Group 7 metal elements such as manganese, Group 8 metal elements such as iron, Group 9 metal elements such as cobalt, Group 10 metal elements such as nickel and platinum, Group 11 metal elements such as copper, silver, and gold, Group 12 metal elements such as zinc, Group 13 metal elements such as aluminum and gallium, and Group 14 metal elements such as germanium and tin. These can be used alone or in combination of two or more.

The metal-based portion 9 includes the metal portion 9 in which the material is a metal.

The cover layer 14 is an insulating layer for protecting the metal-based portion 9. The cover layer 14 covers one surface in the thickness direction exposed from the metal-based portion 9 in the support portion 8, one surfaces (the first upper surface 68, the second upper surface 69, the third upper surface 78, and the fourth upper surface 79) in the thickness direction of the metal-based portion 9, and the side surfaces (the first outer-side surface 63, the first inner-side surface 64, the second inner-side surface 65, the second outer-side surface 66, the third outer-side surface 73, the third inner-side surface 74, the fourth inner-side surface 75, and the fourth outer-side surface 76) of the metal-based portion 9. Examples of a material for the cover layer 14 include insulating resins such as polyimide. A thickness of the cover layer 14 is, for example, 1 μm or more, preferably 5 μm or more, and for example, 500 μm or less, preferably 200 μm or less.

Next, a method for producing the wiring circuit board assembly sheet 1 is described.

The method for producing the wiring circuit board assembly sheet 1 includes, as shown in FIGS. 2A to 3G, a substrate preparation step (ref: FIG. 2A), a resist disposing step (ref: FIGS. 2B to 2C) as one example of a first step, an etching step (ref: FIG. 2D) as one example of a second step, a resist removing step (ref: FIG. 3E), a cover step (ref: FIG. 3F), and an outer-shape trimming step (ref: FIG. 3G) in this order.

Further, the method for producing the wiring circuit board assembly sheet 1 is, for example, carried out in accordance with a roll-to-roll method. As referred to FIG. 4B, in the roll-to-roll method, by using a steering roll 15 and a winding roll 16 disposed on both end portions in the longitudinal direction of a producing device (the whole is not shown) of the wiring circuit board assembly sheet 1, each member to be described later delivered from the steering roll 15 is delivered toward the winding roll 16 in each of the steps.

As shown in FIG. 2A, in the substrate preparation step, a two-layer substrate 40 including the support sheet 6 and a metal-based sheet 17 disposed on one surface in the thickness direction thereof is prepared. The two-layer substrate 40 preferably includes only the support sheet 6 and the metal-based sheet 17.

In the substrate preparation step, the opening portion 13 described above (ref: FIG. 3G) is not yet formed in the support sheet 6, and the support sheet 6 is prepared as a long sheet continuous in the longitudinal direction without having the opening portion 13. On the other hand, the support sheet 6 includes the short-length directional one end edge 4 and the short-length directional other end edge 5.

The metal-based sheet 17 is disposed on the entire one surface in the thickness direction of the support sheet 6. In the substrate preparation step, the metal-based sheet 17 is not yet formed into a pattern corresponding to the metal-based portion 9 described above, and is prepared as a long sheet continuous in the longitudinal direction. A material and a thickness of the metal-based sheet 17 are the same as those of the metal-based portion 9 described above. The metal-based sheet 17 includes the metal sheet 17 in which the material is a metal.

For example, a resin is applied to the other surface in the thickness direction of the metal-based sheet 17 to be then dried to form the support sheet 6, so that the two-layer substrate 40 is prepared. Or, the two-layer substrate 40 including the support sheet 6 and the metal-based sheet 17 in advance can be also prepared as it is.

As shown in FIGS. 2B to 2C, and 4A, in the resist disposing step, the etching resist 2 in a generally rectangular frame shape is disposed on one surface in the thickness direction of the metal-based sheet 17.

To dispose the etching resist 2 on the metal-based sheet 17, for example, as shown in FIG. 2B, first, the dry film resist 3 having a sheet-shape is disposed on the entire one surface in the thickness direction of the metal-based sheet 17.

As shown in FIGS. 2C and 4A, next, the etching resist 2 having a generally rectangular frame shape is formed by photolithographically (exposure and development) of the dry film resist 3.

The etching resist 2 has generally the same shape when viewed from the top as the metal-based portion 9 described above to be formed (ref: FIGS. 1 and 3G). That is, the etching resist 2 integrally includes a first resist piece 21 having generally the same shape when viewed from the top as the first metal piece 11 to be formed, and a second resist piece 22 having generally the same shape when viewed from the top as the second metal piece 12 to be formed.

The first resist piece 21 is along the first direction. The two first resist pieces 21 are disposed at spaced intervals to each other in the second direction. The two first resist pieces 21 have the same length, and consist of a one-side first resist piece 31 disposed on one side in the second direction and an other-side first resist piece 33 disposed on the other side in the second direction thereof. The first resist piece 21 has a generally rectangular shape when viewed in the cross-sectional view, and the one-side first resist piece 31 integrally includes, for example, a first resist outer-side surface 51 facing one side in the second direction, a first resist inner-side surface 53 facing the other-side first resist piece 33, and a first resist upper surface 55 connecting one end edges in the thickness direction of these. A third extension line E3 obtained by extending the first resist piece 21 is inclined with respect to the short-length directional one end edge 4 of the support sheet 6.

The second resist piece 22 is along the second direction. The two second resist pieces 22 are disposed at spaced intervals to each other in the first direction. The two second resist pieces 22 have the same length, and consist of a one-side second resist piece 32 disposed on one side in the first direction and an other-side second resist piece 34 disposed on the other side in the first direction thereof. The second resist piece 22 has a generally rectangular shape when viewed in the cross-sectional view, and the one-side second resist piece 32 integrally includes, for example, a second resist outer-side surface 52 facing one side in the first direction, a second resist inner-side surface 54 facing the other-side second resist piece 34, and a second resist upper surface 56 connecting one end edges in the thickness direction of these. A fourth extension line E4 obtained by extending the second resist piece 22 is inclined with respect to the short-length directional one end edge 4 of the support sheet 6.

A second directional length W3 of the first resist piece 21 is the same as a first directional length W4 of the second resist piece 22. The second directional length W3 of the first resist piece 21 is a length between the first resist outer-side surface 51 and the first resist inner-side surface 53. The first directional length W4 of the second resist piece 22 is a length between the second resist outer-side surface 52 and the second resist inner-side surface 54.

A dimension of the etching resist 2 when viewed from the top can be set to be slightly larger than the metal-based portion 9 in advance by anticipating that the metal-based sheet 17 is overetched (causing an overetching portion 50) in the etching to be described later in the etching step (ref: a phantom line of FIG. 2D).

Thus, a resist laminate 23 sequentially including the support sheet 6, the metal-based sheet 17, and the etching resist 2 toward one side in the thickness direction is fabricated. The resist laminate 23 preferably includes only the support sheet 6, the metal-based sheet 17, and etching resist 2.

As shown in FIGS. 2D and 4A to 4C, in the etching step, the metal-based sheet 17 exposed from the etching resist 2 is etched, while the resist laminate 23 is moved.

In the etching step, for example, an etching device 25 is used.

The etching device 25 is disposed between the steering roll 15 and the winding roll 16. The etching device 25 includes a discharge portion 26. The discharge portion 26 is disposed along the width direction. Specifically, the discharge portion 26 has a plurality of discharge ports 27 disposed in alignment at spaced intervals in a direction perpendicular to an opposing direction of the steering roll 15 and the winding roll 16 and the thickness direction of the resist laminate 23. The opposing direction described above corresponds to an MD direction, and also corresponds to the longitudinal direction of the resist laminate 23. Further, the perpendicular direction described above corresponds to a TD direction, and also corresponds to the width direction of the resist laminate 23. The discharge portion 26 is, for example, disposed on one side in the thickness direction of the resist laminate 23 with respect to a predetermined position to which the resist laminate 23 is conveyed in the etching device 25. The plurality of discharge ports 27 are configured to be capable of continuously discharging an etching solution with respect to the metal-based sheet 17.

As shown by the bold arrows of FIGS. 4A and 4B, in the etching step, the resist laminate 23 is delivered from the steering roll 15 toward the etching device 25. The direction (conveyance direction as one example of a moving direction) in which the resist laminate 23 is delivered is along the short-length directional one end edge 4 and the short-length directional other end edge 5 of the support sheet 6 in the resist laminate 23.

The resist laminate 23 is delivered from the steering roll 15 toward the etching device 25 in a state where both the first resist piece 21 and the second resist piece 22 are inclined with respect to the conveyance direction (one example of the moving direction) of the resist laminate 23.

As shown by broken line arrows of FIGS. 4B and 4C, at the same time, the etching solution is continuously discharged from the plurality of discharge ports 27 toward the resist laminate 23.

An example of the etching solution includes a chemical solution that corrodes (erodes, dissolves) the material for the metal-based sheet 17, and does not corrode the etching resist 2 and the support sheet 6.

Then, the etching solution is brought into contact with one surface in the thickness direction of the metal-based sheet 17 exposed from the etching resist 2, and the etching progresses from such a surface toward the other side in the thickness direction.

Specifically, the etching solution is discharged from the plurality of discharge ports 27, while both the first resist piece 21 and the second resist piece 22 are conveyed in a state of being inclined with respect to the conveyance direction of the resist laminate 23. Then, as shown by solid line arrows of FIGS. 2C' and 4A, the etching solution vigorously collides with the first resist outer-side surface 51 of the one-side first resist piece 31, and subsequently, quickly etches the metal-based sheet 17 in the vicinity of the downstream in the conveyance direction thereof. At the same time, the etching solution vigorously collides with the second resist outer-side surface 52 of the one-side second resist piece 32, and subsequently, quickly etches the metal-based sheet 17 in the vicinity of the downstream in the conveyance direction thereof.

As shown by the broken line arrows of FIGS. 2C' and 4A, in the one-side first resist piece 31, a portion of the etching solution that collides with the first resist outer-side surface 51 passes over the first resist upper surface 55 to reach the vicinity of the upstream side in the conveyance direction of the first resist inner-side surface 53. The etching solution is slowly brought into contact with the first resist inner-side surface 53 as compared with the collision with respect to the first resist outer-side surface 51 described above. Thus, the etching solution slowly etches the metal-based sheet 17 in the vicinity of the upstream in the conveyance direction of the first resist inner-side surface 53. At the same time, in the one-side second resist piece 32, a portion of the etching solution that collides with the second resist outer-side surface 52 passes over the second resist upper surface 56 to reach the vicinity of the upstream side in the conveyance direction of the second resist inner-side surface 54. The etching solution is slowly brought into contact with the second resist inner-side surface 54 as compared with the collision with respect to the second resist outer-side surface 52 described above. Thus, the etching solution slowly etches the metal-based sheet 17 in the vicinity of the upstream in the conveyance direction of the second resist inner-side surface 54.

The etching solution flows along the second resist outer-side surface 52 of the one-side second resist piece 32, and thereafter, wraps around a first corner portion 81 of the one-side second resist piece 32 and the other-side first resist piece 33. The etching solution slowly etches the metal-based sheet 17 in the vicinity of the upstream in the conveyance direction of the other-side first resist piece 33. At the same time, the etching solution flows along the first resist outer-side surface 51 of the one-side first resist piece 31, and thereafter, wraps around a second corner portion 82 of the one-side first resist piece 31 and the other-side second resist piece 34 (corner portion facing the first corner portion 81).

The etching solution slowly etches the metal-based sheet 17 in the vicinity of the upstream in the conveyance direction of the other-side second resist piece 34.

On the other hand, the etching solution passing over the one-side second resist piece 32 collides with the other-side first resist piece 33 to etch the metal-based sheet 17 in the vicinity of the downstream in the conveyance direction of the other-side first resist piece 33, and also, a portion of the etching solution passes over the other-side first resist piece 33 to etch the metal-based sheet 17 in the vicinity of the upstream of the other-side first resist piece 33. At the same time, the etching solution passing over the one-side first resist piece 31 collides with the other-side second resist piece 34 to etch the metal-based sheet 17 in the vicinity of the downstream in the conveyance direction of the other-side second resist piece 34, and also, a portion of the etching solution passes over the other-side second resist piece 34 to etch the metal-based sheet 17 in the vicinity of the upstream in the conveyance direction of the other-side second resist piece 34.

Thus, as shown in FIG. 2D, the metal-based portion 9 having generally the same shape when viewed from the top (that is, a generally rectangular frame shape when viewed from the top) as the etching resist 2 having a generally rectangular frame shape when viewed from the top is formed.

The resist laminate 23 including the metal-based portion 9 is subjected to appropriate processing such as cleaning, drying, or the like to be then wound around the winding roll 16.

Thereafter, as shown in FIG. 3E, in the resist removing step, the etching resist 2 is, for example, removed by peeling or the like.

Thereafter, as shown in FIG. 3F, in the cover step, the cover layer 14 is disposed on one side in the thickness direction of the support sheet 6 so as to cover one surface in the thickness direction and the side surface of the metal-based portion 9.

Thereafter, as shown in FIG. 3G, in the outer-shape trimming step, by trimming the support sheet 6, the opening portion 13 is formed in the support sheet 6 so as to penetrate in the thickness direction. At the same time, the joint 10 (ref: FIG. 1) is formed, and the plurality of wiring circuit boards 7 are supported separably by the support sheet 6 through the joint 10. As the trimming of the support sheet 6, for example, etching, cutting, or the like are used.

Thus, the wiring circuit board assembly sheet 1 including the support sheet 6 and the plurality of wiring circuit boards 7 is produced.

Thereafter, by cutting the joint portion 10, as shown in the lower right view of FIG. 1, by separating the wiring circuit board 7 from the support sheet 6, the wiring circuit board 7 is obtained.

Then, in the wiring circuit board assembly sheet 1, the metal-based portion 9 is formed by discharge of the etching solution from the discharge portion 26 disposed along the TD direction perpendicular to the MD direction corresponding to the longitudinal direction, while the support sheet 6 is conveyed to the etching device 25 along the longitudinal direction in which the short-length directional one end edge 4 extends. Therefore, both the first metal piece 11 and the second metal piece 12 are inclined with respect to the MD direction, so that they are also inclined with respect to the TD direction. Therefore, both the first metal piece 11 and the second metal piece 12 are also inclined with respect to the discharge portion 26. Thereafter, the first metal piece 11 and the second metal piece 12 are formed under the same etching conditions as described above.

Specifically, as shown in FIG. 4A, the momentum of the etching solution colliding with the first resist outer-side surface 51 of the one-side first resist piece 31 is comparable with the momentum of the etching solution colliding with the second resist outer-side surface 52 of the one-side second resist piece 32 because both the one-side first resist piece 31 and the one-side second resist piece 32 are inclined with respect to the discharge portion 26. Therefore, the etching rate of the metal-based sheet 17 in the vicinity of the downstream in the conveyance direction of the first resist outer-side surface 51 is comparable with the etching rate of the metal-based sheet 17 in the vicinity of the downstream in the conveyance direction of the second resist outer-side surface 52.

Therefore, as shown in FIG. 2D, the positional accuracy of the first outer-side surface 63 of the one-side first metal piece 61 is comparable with the positional accuracy of the third outer-side surface 73 of the one-side second metal piece 71. Therefore, it is possible to match the positional accuracy of the outer shape of the one-side first metal piece 61 and the one-side second metal piece 71.

Furthermore, as shown in FIG. 4A, the etching solution which flows along the second resist outer-side surface 52 of the one-side second resist piece 32 to then wrap around the first corner portion 81 slowly etches the metal-based sheet 17 in the vicinity of the upstream in the conveyance direction (the other side in the second direction) of the other-side first resist piece 33.

Further, the etching solution which flows along the first resist outer-side surface 51 of the one-side first resist piece 31 to then wrap around the second corner portion 82 slowly etches the metal-based sheet 17 in the vicinity of the upstream in the conveyance direction (the other side in the first direction) of the other-side second resist piece 34.

Then, the slowness of the etching of the metal-based sheet 17 in the vicinity of the upstream in the conveyance direction of the other-side first resist piece 33 is comparable with the slowness of the etching of the metal-based sheet 17 in the vicinity of the upstream in the conveyance direction of the other-side second resist piece 34, and the etching rate of both also becomes comparable with each other.

Therefore, as shown in FIG. 1, the positional accuracy of the second outer-side surface 66 of the other-side first metal piece 62 is comparable with the positional accuracy of the fourth outer-side surface 76 of the other-side second metal piece 72. Therefore, it is possible to match the positional accuracy of the outer shape of the other-side first metal piece 62 and the other-side second metal piece 72.

Overall, the outer shape of the first metal piece 11 and the second metal piece 12 is formed with the same accuracy. As a result, the wiring circuit board assembly sheet 1 can include the wiring circuit board 7 including the metal-based portion 9 having excellent positional accuracy of the outer shape.

Figure 5B:
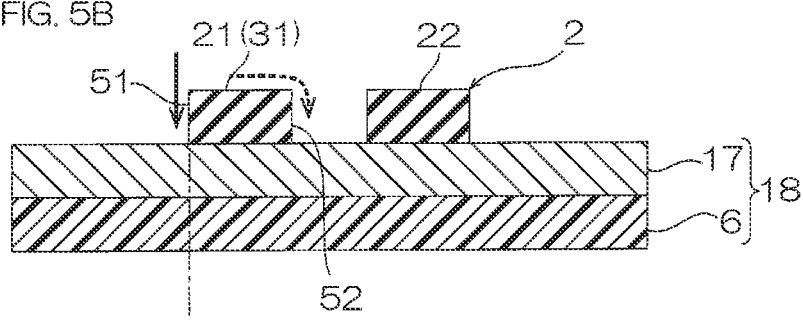

On the other hand, as shown in FIGS. 5A and 5B, in comparative example in which the first direction is along the short-length direction and the second direction is along the longitudinal direction, the first direction is perpendicular to the MD direction. Then, in the etching step, the etching solution collides most vigorously with the first resist outer-side surface 51 of the one-side first resist piece 31 to etch the metal-based sheet 17 in the vicinity of the downstream in the conveyance direction of the one-side first resist piece 31 at the fastest etching rate.

Subsequently, the etching solution which wraps around both end portions of the one-side first resist piece 31 is relatively slowly brought into contact with the outer-side surfaces of the two second resist pieces 22. Therefore, the etching rate of the metal-based sheet 17 in the vicinity of the outer-side of the second resist piece 22 is slower than the etching rate of the metal-based sheet 17 in the vicinity of the downstream in the conveyance direction of the one-side first resist piece 31.

Thereafter, the etching solution which further wraps around the upstream side end portions in the conveyance direction of the two second resist pieces 22 is most slowly brought into contact with the other-side first resist piece 33. Therefore, the etching rate of the metal-based sheet 17 in the vicinity of the upstream in the conveyance direction of the other-side first resist piece 33 is further slower than the etching rate of the metal-based sheet 17 in the vicinity of the outer-side of the second resist piece 22, that is, the slowest.

Figure 5C:
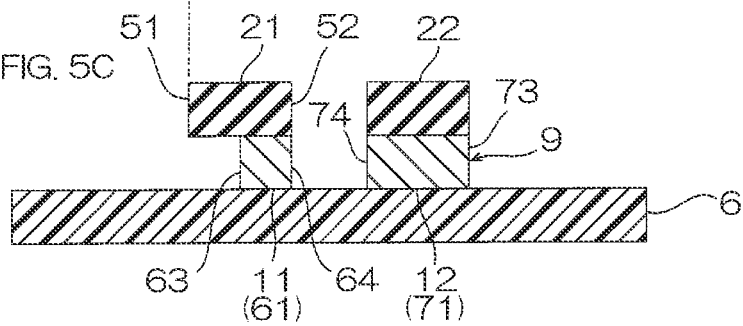

Then, as shown in FIG. 5C, the positional accuracy of the first outer-side surface 63 of the one-side first metal piece 61 (the first metal piece 11 on one side) mismatches the positional accuracy of the outer-side surfaces of the one-side second metal piece 71 and the other-side second metal piece 72 (the two second metal pieces 12) (in FIG. 5C, only the other-side second metal piece 72 is shown).

Furthermore, the positional accuracy of the outer-side surfaces of the one-side second metal piece 71 and the other-side second metal piece 72 (the two second metal pieces 12) also mismatches the positional accuracy of the second outer-side surface 66 of the other-side first metal piece 62 (the first metal piece 11 on the other side).

Therefore, the outer shape of the first metal piece 11 and the second metal piece 12 is formed with completely different accuracy.

On the other hand, in the method for producing the wiring circuit board assembly sheet 1, as referred to FIG. 4A, in the etching step, the metal-based sheet 17 exposed from the etching resist 2 is etched, while the resist laminate 23 is moved in a state where both the first resist piece 21 and the second resist piece 22 are inclined with respect to the conveyance direction of the resist laminate 23, so that both the first resist piece 21 and the second resist piece 22 are inclined with respect to the MD direction which is the conveyance direction. Therefore, both the first resist piece 21 and the second resist piece 22 are also inclined with respect to the alignment direction of the plurality of discharge ports 27. Both the first metal piece 11 and the second metal piece 12 are formed by the etching solution discharged from the discharge portion 26 of the etching device 25 under the same conditions. Therefore, the first metal piece 11 and the second metal piece 12 can be formed with the same accuracy of the outer shape. As a result, it is possible to produce the wiring circuit board assembly sheet 1 including the metal-based portion 9 having excellent accuracy of the outer shape.

Furthermore, the etching solution passing over the one-side second resist piece 32 etches the metal-based sheet 17 in the vicinity of the upstream in the conveyance direction of the one-side second resist piece 32, and subsequently, collides with the other-side first resist piece 33 to vigorously etch the metal-based sheet 17 in the vicinity of the downstream in the conveyance direction of the other-side first resist piece 33. Further, the etching solution passing over the one-side first resist piece 31 etches the metal-based sheet 17 in the vicinity of the upstream in the conveyance direction of the one-side first resist piece 31, and subsequently, collides with the other-side second resist piece 34 to vigorously etch the metal-based sheet 17 in the vicinity of the downstream in the conveyance direction of the other-side second resist piece 34.

Then, in the producing method, in the resist disposing step, the second directional length W3 of the first resist piece 21 (the one-side first resist piece 31 and the other-side first resist piece 33) is the same as the first directional length W4 of the second resist piece 22 (the one-side second resist piece 32 and the other-side second resist piece 34). Therefore, in the etching step, the conditions in which the etching solution passes over the one-side first resist piece 31 can be the same as the conditions in which the etching solution passes over the one-side second resist piece 32, and also, the conditions in which the etching solution collides with the other-side first resist piece 33 can be the same as the conditions in which the etching solution collides with the other-side second resist piece 34.

Therefore, the etching of the metal-based sheet 17 in the vicinity of the upstream in the conveyance direction of the one-side first resist piece 31, and the etching of the metal-based sheet 17 in the vicinity of the upstream in the conveyance direction of the one-side second resist piece 32 can be carried out under the same conditions. At the same time, the etching of the metal-based sheet 17 in the vicinity of the downstream in the conveyance direction of the other-side first resist piece 33, and the etching of the metal-based sheet 17 in the vicinity of the downstream in the conveyance direction of the other-side second resist piece 34 can be carried out under the same conditions.

Therefore, the second directional length W1 of the one-side first metal piece 61 covered with the one-side first resist piece 31 can be the same as the first directional length W2 of the one-side second metal piece 71 covered with the one-side second resist piece 32. At the same time, the second directional length W1 of the other-side first metal piece 62 covered with the other-side first resist piece 33 can be the same as the first directional length W2 of the other-side second metal piece 72 covered with the other-side second resist piece 34.

Overall, the second directional length W1 of the first piece 11 covered with the first resist piece 21 can be the same as the first directional length W2 of the second piece 12 covered with the second resist piece 22.

Further, in the wiring circuit board assembly sheet 1, since the metal-based portion 9 includes a wiring, it is possible to achieve desired electrical properties.

Furthermore, in the method for producing the wiring circuit board 7, since the wiring circuit board assembly sheet 1 described above is produced, and thereafter, the wiring circuit board 7 is separated from the support sheet 6, it is possible to produce the wiring circuit board 7 including the metal-based portion 9 having excellent accuracy of the outer shape.

The applications of the wiring circuit board 7 are not particularly limited, and can be used in various fields. The wiring circuit board 7 is, for example, used for various applications such as a wiring circuit board for an electronic device (wiring circuit board for an electronic component) and a wiring circuit board for an electrical device (wiring circuit board for an electrical component). Examples of the wiring circuit board for an electronic device and the wiring circuit board for an electrical device include wiring circuit boards for sensors used for sensors such as position information sensors, obstacle detection sensors, and temperature sensors; wiring circuit boards for transport vehicles used for transport vehicles such as automobiles, trains, aircrafts, and working vehicles; wiring circuit boards for video equipment used for video equipment such as flat panel displays, flexible displays, and projection video equipment; wiring circuit boards for communication relaying equipment used for communication relay devices such as network equipment and large communication equipment; wiring circuit boards for information processing terminals used for information processing terminals such as computers, tablets, smartphones, and home games; wiring circuit boards for mobile devices used for mobile devices such as drones and robots; wiring circuit boards for medical devices used for medical devices such as wearable medical equipment and medical diagnostic devices; wiring circuit boards for electrical devices used for electrical devices such as refrigerators, washing machines, vacuum cleaners, and air conditioners; and wiring circuit boards for recording electronic devices used for recording electronic devices such as digital cameras and DVD recording devices.

MODIFIED EXAMPLES

In the following modified examples, the same reference numerals are provided for members and steps corresponding to each of those in the above-described one embodiment, and their detailed description is omitted. Further, each of the modified examples can achieve the same function and effect as that of one embodiment unless otherwise specified. Furthermore, one embodiment and the modified examples can be appropriately used in combination.

In one embodiment, in the etching step, wet etching in which the etching solution is used with respect to the metal-based sheet 17 is carried out. Alternatively, for example, dry etching such as laser processing can be also carried out. In this case, a laser irradiation portion which is not shown and is capable of scanning in the TD direction is provided in a laser irradiation device which is not shown.

As shown in FIG. 1, in one embodiment, the width W1 of the first metal piece 11 is the same as the width W2 of the second metal piece 12. Alternatively, as shown in FIG. 6B, they may be different.

Figure 6A:
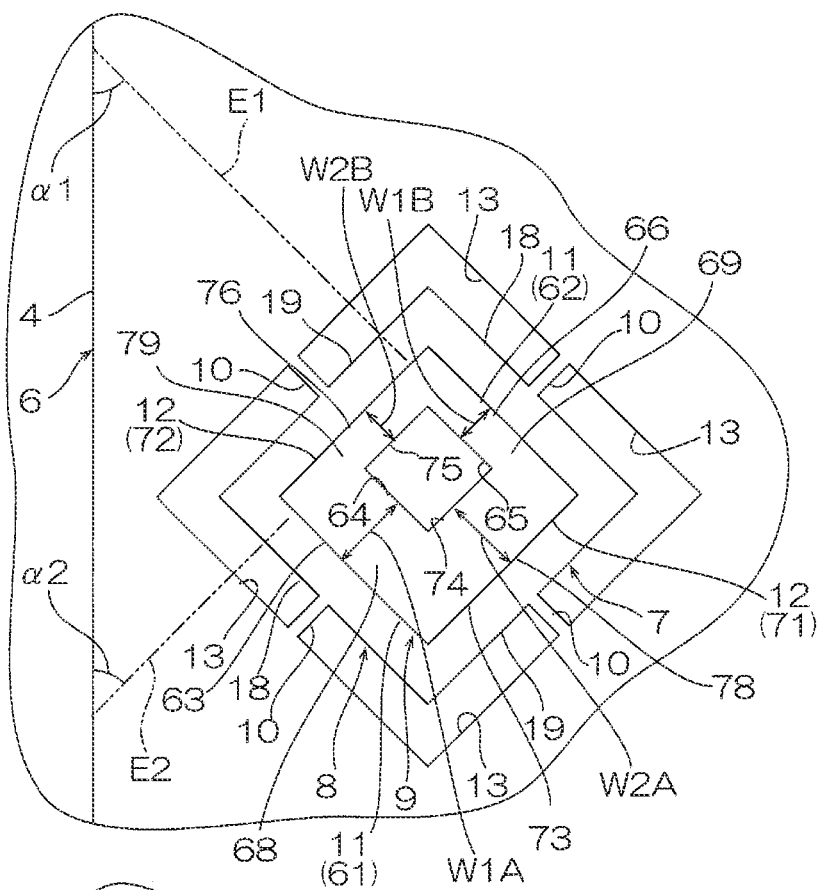
FIGS. 6A and 6B show enlarged plan views of a modified example of a wiring circuit board of the wiring circuit board assembly sheet shown in FIG. 1.
Figure 6B:
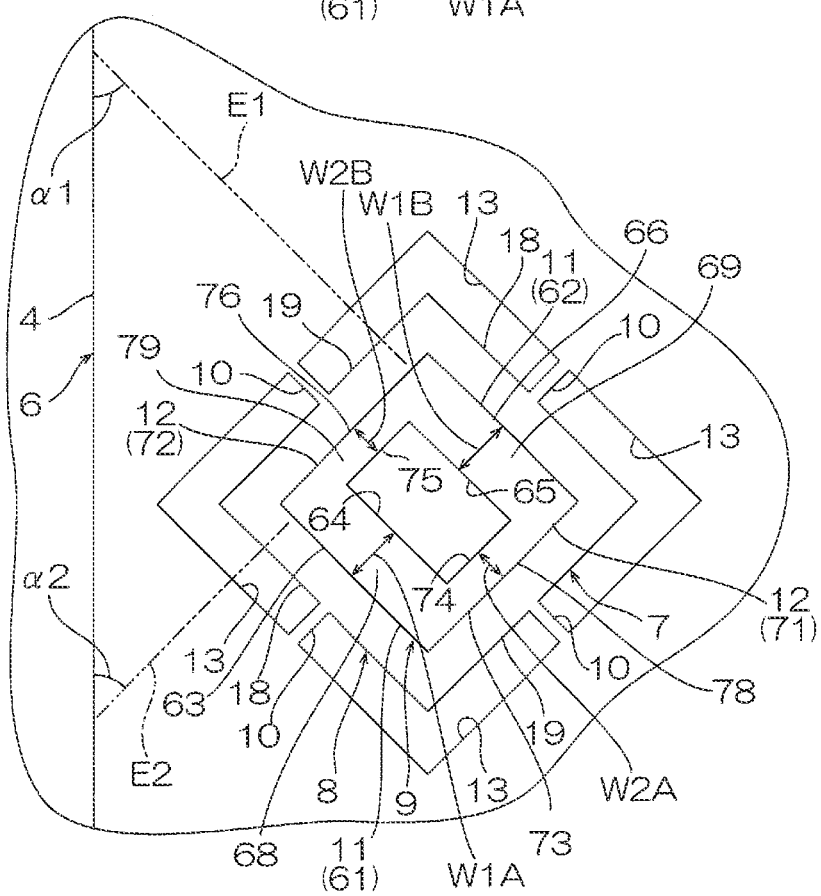

In the modified example shown in FIG. 6B, a width W1A of the one-side first metal piece 61 is different from a width W2A of the one-side second metal piece 71, and is, for example, larger than the width W2A of the one-side second metal piece 71. Alternatively, though not shown, the size of these may be the reversed.

In the modified example shown in FIG. 6B, a width W1B of the other-side first metal piece 62 is different from a width W2B of the other-side second metal piece 72, and is, for example, larger than the width W2B of the other-side second metal piece 72. Alternatively, though not shown, the size of these may be the reversed.

Further, as shown in FIG. 6A, the width W1 of the two first metal pieces 11 may be different from each other. The width W1A of the one-side first metal piece 61 is different from the width W1B of the other-side first metal piece 62, and is, for example, larger than the width W1B of the other-side first metal piece 62. Alternatively, though not shown, the size of these may be the reversed.

Further, in the modified example shown in FIG. 6A, the width W2 of the two first metal pieces 12 may be different from each other. The width W2A of the one-side second metal piece 71 is different from the width W2B of the other-side second metal piece 72, and is, for example, larger than the width W2B of the other-side second metal piece 72. Alternatively, though not shown, the size of these may be the reversed.

Further, as shown by a solid line of FIG. 3G, in one embodiment, the support portion 8 is a single layer, but may be a multilayer. In the modified example, as shown by the phantom line of FIG. 3G, preferably, the support portion 8 is a two-layer.

Figure 8F:
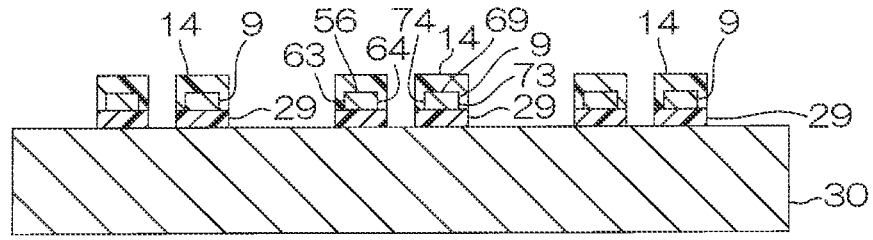
FIGS. 8F to 8I, subsequent to FIG. 7E, show a modified example of the producing method of FIGS. 2A to 3G.
Figure 8G:
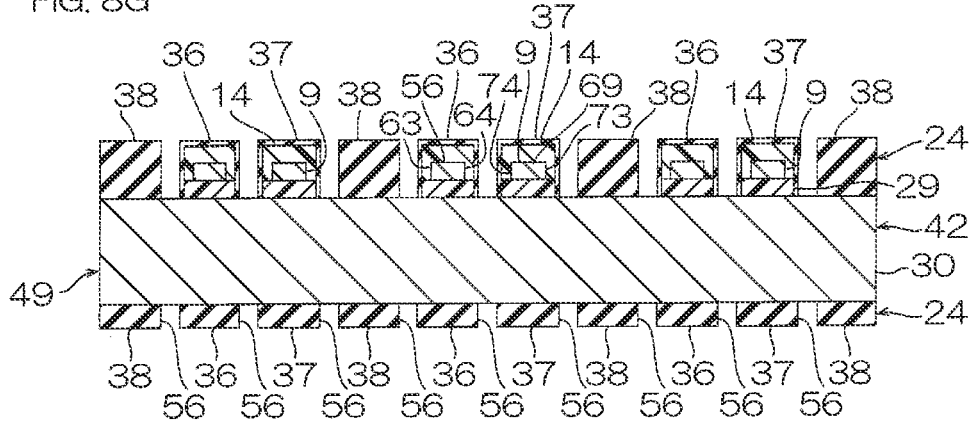
Figure 8H:
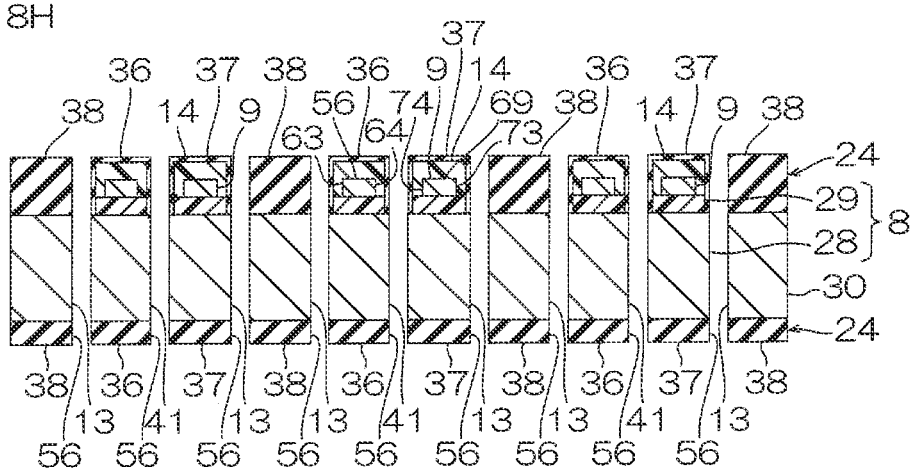
Figure 8I:
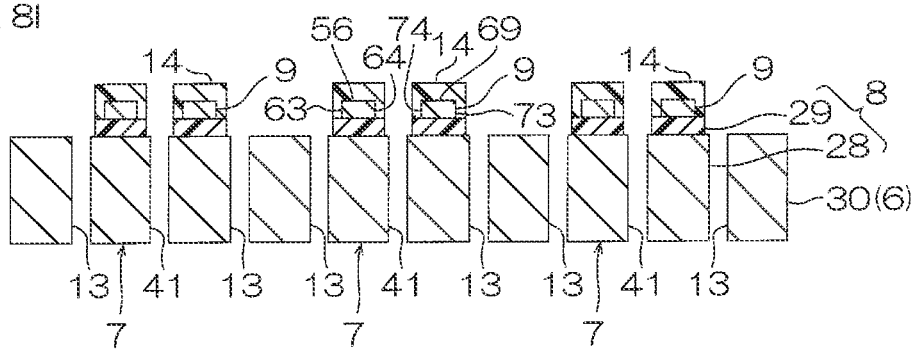

Specifically, as shown in FIG. 8I, the support portion 8 is the two-layer, and sequentially includes, for example, a metal support portion 28 and a resin support portion 29 as one example of a support layer toward one side in the thickness direction. In the modified example, preferably, the support portion 8 includes only the metal support portion 28 and the resin support portion 29.

Further, in the modified example, one example of the metal-based portion of the present invention is the metal-based portion 9, and further, the metal support portion 28.

As shown in FIGS. 2C to 2D, in one embodiment, each of the resist disposing step and the etching step is carried out once. Alternatively, for example, the resist disposing step and the etching step can be also carried out a plurality of times.

Figure 7A:
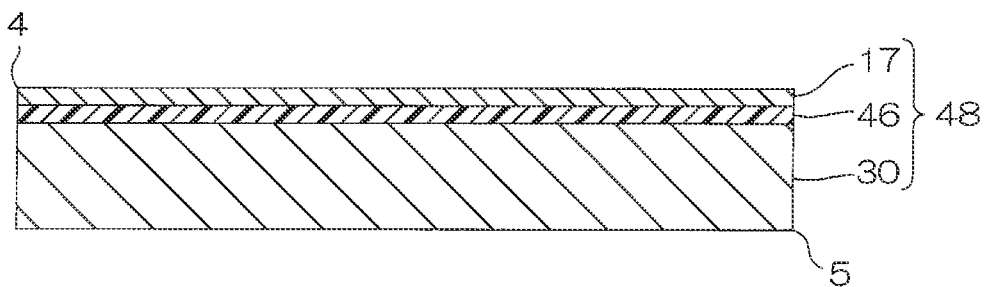
FIGS. 7A to 7E show a modified example of the producing method of FIGS. 2A to 3G.
Figure 7B:
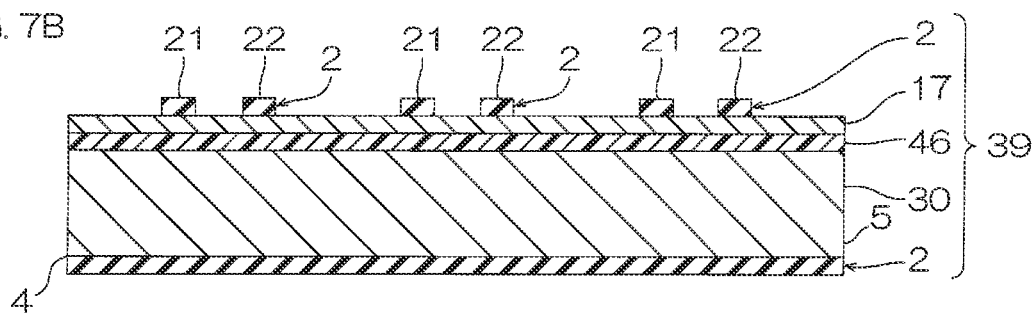
Figure 7C:
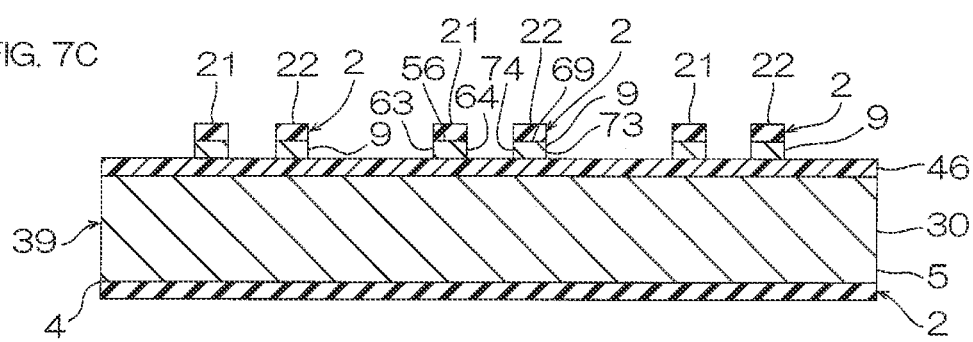

For example, as shown in FIGS. 7B to 7C, the metal-based portion 9 is formed from the metal-based sheet 17 in the first-time etching step, and thereafter, as shown in FIGS. 8G to 8H, the metal support portion 28 is formed from a metal support sheet 30 in the second-time etching step.

In the modified example, for example, as shown in FIG. 7A, first, a three-layer substrate 48 which sequentially includes the metal support sheet 30 as one example of a support sheet, an insulating sheet 46, and the metal-based sheet 17 toward one side in the thickness direction is prepared. Both the insulating sheet 46 and the metal-based sheet 17 have the same shape as the metal support sheet 30 when viewed from the top. Examples of a material for the insulating sheet 46 include resins illustrated in the support sheet 6 in one embodiment. The three-layer substrate 48 has the short-length directional one end edge 4 and the short-length directional other end edge 5 parallel with each other.

As shown in FIG. 7B, thereafter, the etching resist 2 is disposed on both surfaces in the thickness direction of the three-layer substrate 48. Specifically, the etching resist 2 is formed by the pattern described above on one surface in the thickness direction of the metal-based sheet 17, and is disposed on the enter other surface in the thickness direction of the metal-based sheet 17.

Thus, a first resist laminate 39 including the three-layer substrate 48 and the etching resist 2 is fabricated.

As shown in FIG. 7C, thereafter, the first-time etching step is carried out in which the metal-based sheet 17 exposed from the etching resist 2 is etched, while the first resist laminate 39 is conveyed in a state where the first resist piece 21 and the second resist piece 22 of the etching resist 2 are inclined with respect to the conveyance direction. Thus, the metal-based portion 9 having a generally rectangular frame shape when viewed from the top is formed.

Figure 7D:
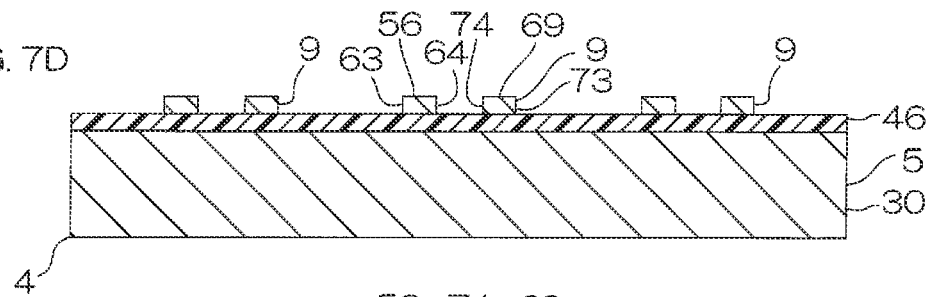

As shown in FIG. 7D, thereafter, the etching resist 2 is removed.

Figure 7E:
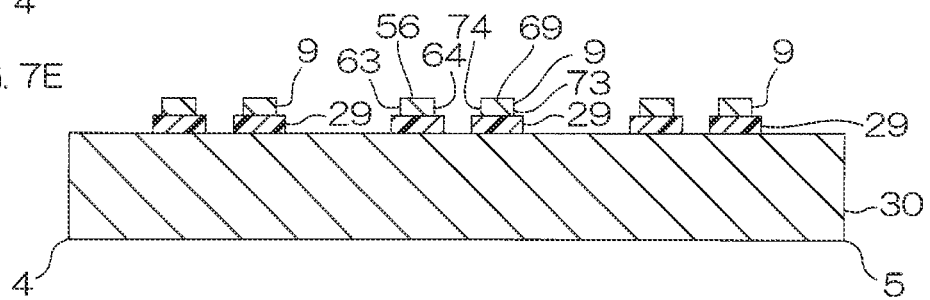

As shown in FIG. 7E, the resin support portion 29 is, for example, formed from the insulating sheet 46 by cutting, etching, or the like.

As shown in FIG. 8F, subsequently, the cover layer 14 is disposed on one side in the thickness direction of the resin support portion 29 so as to cover one surface in the thickness direction and the side surface of the metal-based portion 9.

As shown in FIGS. 8G to 8I, thereafter, the second-time resist disposing step and the etching step are sequentially carried out.

As shown in FIG. 8G, specifically, first, a second etching resist 24 including a third resist piece 36, a fourth resist piece 37, and a fifth resist portion 38 is disposed on both surfaces in the thickness direction of the metal support sheet 30. The second etching resist 24 disposed on one surface in the thickness direction of the metal support sheet 30 has the same shape as the second etching resist 24 disposed on the other surface in the thickness direction of the metal support sheet 30 when projected in the thickness direction. The third resist piece 36 and the fourth resist piece 37 disposed on one surface in the thickness direction of the metal support sheet 30 cover the side surface of the resin support portion 29, and the side surface and one surface in the thickness direction of the cover layer 14. Thus, a second resist laminate 49 is fabricated, and the second-time resist disposing step is carried out.

Thereafter, as shown in FIG. 8H, the second-time etching step is carried out in which the metal support sheet 30 exposed from the second etching resist 24 is etched, while the second resist laminate 49 is conveyed in a state where the third resist piece 36 and the fourth resist piece 37 of the second etching resist 24 are inclined with respect to the conveyance direction (the depth direction on the plane of the sheet in FIG. 7). Thus, the metal support portion 28 having a generally rectangular frame shape when viewed from the top is formed.

Thereafter, as shown in FIG. 8I, the second etching resist 24 is removed.

Thus, the wiring circuit board assembly sheet 1 including the plurality of wiring circuit boards 7 is produced.

The wiring circuit board 7 includes a metal support portion 28, a resin support portion 29 disposed on one surface in the thickness direction thereof, the metal-based portion 9 disposed on one surface in the thickness direction thereof, and the cover layer 14 disposed on one surface in the thickness direction of the resin support portion 29 so as to cover one surface in the thickness direction and the side surface of the metal-based portion 9. The wiring circuit board 7 has a second opening portion 41 penetrating in the thickness direction.

In the wiring circuit board assembly sheet 1, since the metal support portion 28 is included in the support portion 8, the metal support portion 28 can diffuse the heat generated in the metal-based portion 9 based on the thermal conductivity to be planned, while reliably supporting the metal-based portion 9 through the insulating support portion 29. In particular, since the wiring circuit board 7 includes the second opening portion 41, it is also possible to further improve the thermal conductivity by convection based on the flow of the air in the second opening portion 41.

Further, in the etching step of one embodiment and the modified examples described above, at least the metal-based sheet 17 is etched. Specifically, in one embodiment shown in FIG. 2D, the metal-based sheet 17 is etched, and in the modified example shown in FIGS. 7E and 8I, the metal-based sheet 17 and the metal support sheet 30 are etched. Alternatively, for example, though not shown, only the metal support sheet 30 is etched without etching the metal-based sheet 17, and the metal support portion 28 only can be formed as one example of a metal-based portion.

Further, for example, the wiring circuit board assembly sheet 1 can be also produced by a single wafer method instead of the roll-to-roll method.

Furthermore, as shown in FIG. 9A, the second step can be also carried out by inclining the two-layer substrate 23 having a generally rectangular shape when viewed from the top having a predetermined length with respect to both directions of the conveyance direction and the direction along the discharge portion 26 to be delivered to the etching device 25.

The two-layer substrate 23 has a longitudinal directional one end edge 43 and a longitudinal directional other end edge 44 in addition to the short-length directional one end edge 4 and the short-length directional other end edge 5. In the two-layer substrate 23, the short-length directional one end edge 4 and the short-length directional other end edge 5 have the same length. Further, the longitudinal directional one end edge 43 and the longitudinal directional other end edge 44 have the same length, and connect the short-length directional one end edge 4 to the short-length directional other end edge 5.

The outer shape having a rectangular frame shape of the etching resist 2 is disposed in parallel straight with respect to the longitudinal direction of the two-layer substrate 23. Specifically, the first resist piece 21 is parallel with the short-length directional one end edge 4 of the two-layer substrate 23. The second resist piece 22 is parallel with the longitudinal directional one end edge 43 of the two-layer substrate 23.

In the second step, the resist laminate 23 is conveyed to the etching device 25 in a state where the first resist piece 21 is inclined with respect to the conveyance direction and the direction along the discharge portion 26, and the second resist piece 22 is also inclined with respect to the conveyance direction and the direction along the discharge portion 26.

After carrying out the second step, in the resulting wiring circuit board assembly sheet 1, the plurality of wiring circuit boards 7 are disposed in parallel straight with respect to the longitudinal direction of the wiring circuit board assembly sheet 1. Specifically, the first end edge 18 of the wiring circuit board 7 is parallel with the short-length directional one end edge 4 of the wiring circuit board assembly sheet 1. The second end edge 19 of the wiring circuit board 7 is parallel with the longitudinal directional one end edge 43 of the wiring circuit board assembly sheet 1.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The wiring circuit board of the present invention is used for various applications such as a wiring circuit board for an electronic device and a wiring circuit board for an electrical device.

DESCRIPTION OF REFERENCE NUMBER

1 Wiring circuit board assembly sheet
2 Etching resist
4 Short-length directional one end edge
5 Short-length directional other end edge
6 Support sheet
7 Wiring circuit board
9 Metal-based portion
11 First metal piece
12 Second metal piece
17 Metal-based sheet
21 First resist piece
22 Second resist piece
24 Second etching resist
28 Metal support portion
29 Resin support portion
30 Metal support sheet
31 One-side first resist piece
32 One-side second resist piece
33 Other-side first resist piece
34 Other-side second resist piece
39 First resist laminate
49 Second resist laminate

The invention claimed is:

1. A wiring circuit board assembly sheet comprising:
a support sheet having two end edges parallel with each other and
a plurality of wiring circuit boards disposed at spaced intervals to each other in the support sheet, wherein
the wiring circuit board includes a metal-based portion having a generally rectangular frame shape,
the metal-based portion includes
a first piece along a first direction perpendicular to a thickness direction of the support sheet, and
a second piece along a second direction perpendicular to the thickness direction and the first direction, and
both the first piece and the second piece are inclined with respect to the end edges of the support sheet.

2. The wiring circuit board assembly sheet according to claim 1, wherein
the metal-based portion includes a wiring.

3. The wiring circuit board assembly sheet according to claim 1, wherein
the metal-based portion includes a support layer.

* * * * *